US012740180B2

(12) United States Patent
Leipold et al.

(10) Patent No.: US 12,740,180 B2
(45) Date of Patent: Sep. 15, 2026

(54) SILICON BASED QUANTUM DOT STRUCTURE AND QUANTUM DOT ARRAYS INCORPORATING BLIND CONTACTS

(71) Applicant: Equal 1 Laboratories Ireland Limited, Wicklow (IE)

(72) Inventors: Dirk Robert Walter Leipold, Fremont, CA (US); Elena Blokhina, Dublin (IE); Andrii Sokolov, Bray (IE)

(73) Assignee: EQUAL 1 LABORATORIES IRELAND LIMITED, Wicklow (IE)

( * ) Notice: Subject to any disclaimer, the term of this patent is extended or adjusted under 35 U.S.C. 154(b) by 361 days.

(21) Appl. No.: 18/374,687

(22) Filed: Sep. 29, 2023

(65) Prior Publication Data

US 2024/0113240 A1 Apr. 4, 2024

Related U.S. Application Data

(60) Provisional application No. 63/412,705, filed on Oct. 3, 2022.

(51) Int. Cl.
*H10F 77/14* (2025.01)
*G06N 10/40* (2022.01)
(Continued)

(52) U.S. Cl.
CPC ......... *H10F 77/1433* (2025.01); *G06N 10/40* (2022.01); *H10D 30/014* (2025.01); *H10D 48/383* (2025.01)

(58) Field of Classification Search
CPC .. H10F 77/1433; G06N 10/40; H10D 30/014; H10D 48/383; H10D 48/3835; H10D 30/402; H10D 64/27; H10D 62/13
See application file for complete search history.

(56) References Cited

U.S. PATENT DOCUMENTS 10,873,019 B2 * 12/2020 Leipold .................. G06N 10/40
11,611,032 B2 * 3/2023 Leipold .................. G06N 10/40
(Continued)

FOREIGN PATENT DOCUMENTS

EP 1503328 A1 * 2/2005 ............. H04B 10/70
EP 3967650 A1 * 3/2022 ......... H10D 48/3835
(Continued)

*Primary Examiner* — Mohammed Shamsuzzaman
(74) *Attorney, Agent, or Firm* — Zaretsky Group PC; Howard Zaretsky

(57) ABSTRACT

A novel and useful mechanism of improving the controllability of the electrostatic potential profile and electric field between barrier/control gates separating quantum dots (QD) in a quantum dot array (QDA) and creating elongated double quantum dot array 2D structures each having capability for a continuous tunneling within the array structure. Plunger gates implemented as blind contacts improve electric field control between barrier gates in a quantum dot array. Blind contacts create a dedicated control potential under multiple blind contact electrodes placed on a metal layer of a standard FDSOI process. They function to control potential well depths independently for neighboring quantum dots. Two or more coupled quantum dots within one elongated active area enables interconnection of neighboring quantum dot chains using a conductive semiconductor well. The blind contacts enable the implementation of charge sensors, precise pre-charge transistors, and linear and 2D quantum dot array.

16 Claims, 19 Drawing Sheets

(51) Int. Cl.
*H10D 30/01* (2025.01)
*H10D 48/00* (2025.01)

(56) References Cited

U.S. PATENT DOCUMENTS

| | | | | | |
|---|---|---|---|---|---|
| 11,910,728 | B2 * | 2/2024 | Petta | .................. | H10D 48/3835 |
| 11,922,274 | B1 * | 3/2024 | George | .............. | H10D 48/3835 |
| 12,245,523 | B2 * | 3/2025 | Roberts | .............. | H10D 48/3835 |
| 2018/0175241 | A1 * | 6/2018 | Jain | ...................... | H10D 62/814 |
| 2019/0392352 | A1 * | 12/2019 | Lampert | ................... | G06F 1/20 |
| 2020/0003925 | A1 * | 1/2020 | Leipold | ................ | H10D 86/215 |
| 2020/0185512 | A1 * | 6/2020 | Voinigescu | ............ | G06N 10/40 |
| 2020/0220065 | A1 * | 7/2020 | Leipold | ................ | H10N 60/128 |
| 2020/0227523 | A1 * | 7/2020 | Leipold | .................. | G06N 20/00 |
| 2021/0028344 | A1 * | 1/2021 | Petta | .................. | H10D 48/3835 |
| 2021/0296480 | A1 * | 9/2021 | Clarke | ................. | H10D 84/038 |
| 2022/0149823 | A1 * | 5/2022 | Redmond | .............. | G06N 3/045 |
| 2023/0389346 | A1 * | 11/2023 | Li | ........................ | H10D 62/126 |
| 2023/0411557 | A1 * | 12/2023 | Hytha | .................... | H10D 62/83 |

FOREIGN PATENT DOCUMENTS

| | | | | | | |
|---|---|---|---|---|---|---|
| KR | 20110020463 | A | * | 3/2011 | ............. | B82Y 10/00 |
| TW | 202103339 | A | * | 1/2021 | ........... | H10D 30/402 |
| TW | I765717 | B | * | 5/2022 | ......... | H10D 48/3835 |
| WO | WO-2018063138 | A1 | * | 4/2018 | ......... | H10D 48/3835 |
| WO | WO-2019125500 | A1 | * | 6/2019 | ......... | H10D 48/3835 |

* cited by examiner 270
284
286
276
280
272
282
278
282
288
2
1
3
280
274

290
304
306
298
300
284
302
292
305
302
307
300
296

SILICON BASED QUANTUM DOT STRUCTURE AND QUANTUM DOT ARRAYS INCORPORATING BLIND CONTACTS

REFERENCE TO PRIORITY APPLICATION

This application claims the benefit of U.S. Provisional Application No. 63/412,705, filed Oct. 3, 2022, entitled "Quantum Dot Structure Incorporating Blind Contact Electrodes," incorporated herein by reference in its entirety.

FIELD OF THE DISCLOSURE

The subject matter disclosed herein relates to the field of quantum computing and more particularly relates to quantum structures incorporating metal blind contacts in silicon quantum dot arrays.

BACKGROUND OF THE INVENTION

Quantum computing is a new paradigm that exploits fundamental principles of quantum mechanics, such as superposition and entanglement, to tackle problems in mathematics, chemistry and material science that are well beyond the reach of supercomputers. Its power is derived from a quantum bit (qubit), which can simultaneously exist as a superposition of both 0 and 1 states and can become entangled with other qubits. This leads to doubling the computational power with each additional qubit, which can be repeated many times. It has been already shown that quantum computers can speed up some of the algorithms and, potentially, model any physical process.

Quantum computers are machines that perform computations using the quantum effects between elementary particles, e.g., electrons, holes, ions, photons, atoms, molecules, etc. Quantum computing utilizes quantum-mechanical phenomena such as superposition and entanglement to perform computation. Quantum computing is fundamentally linked to the superposition and entanglement effects and the processing of the resulting entanglement states. A quantum computer is used to perform such computations which can be implemented theoretically or physically.

Currently, analog and digital are the two main approaches to physically implementing a quantum computer. Analog approaches are further divided into quantum simulation, quantum annealing, and adiabatic quantum computation. Digital quantum computers use quantum logic gates to do computation. Both approaches use quantum bits referred to as qubits.

Qubits are fundamental to quantum computing and are somewhat analogous to bits in a classical computer. Qubits can be in a |0> or |1> quantum state but they can also be in a superposition of the |0> and |1> states. When qubits are measured, however, they always yield a |0> or a |1> based on the quantum state they were in.

The key challenge of quantum computing is isolating such microscopic particles, loading them with the desired information, letting them interact and then preserving the result of their quantum interaction. This requires relatively good isolation from the outside world and a large suppression of the noise generated by the particle itself. Therefore, quantum structures and computers operate at very low temperatures (e.g., cryogenic), close to the absolute zero kelvin (K), in order to reduce the thermal energy/movement of the particles to well below the energy/movement coming from their desired interaction. Current physical quantum computers, however, are very noisy and quantum error correction is commonly applied to compensate for the noise.

Most existing quantum computers use superconducting structures to realize quantum interactions. Their main drawbacks, however, are the fact that superconducting structures are very large and costly and have difficulty in scaling to quantum processor sizes of thousands or millions of quantum-bits (qubits). Furthermore, they need to operate at few tens of milli-kelvin (mK) temperatures, that are difficult to achieve and where it is difficult to dissipate significant power to operate the quantum machine.

There is thus a need for a mechanism that permits better control over the operation of current quantum structures. In particular, better control over the electrostatic potential profile and electric field between barrier/control gates that separate quantum dots is needed.

SUMMARY OF THE INVENTION

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

The present invention improves controllability of the electrostatic potential profile and electric field between barrier/control gates separating quantum dots (QD) in a quantum dot array (QDA) and creates elongated double quantum dot array 2D structures each having capability for a continuous tunneling within the array structure. An implementation of a plunger gate referred to as a blind contact improves electric field control between barrier gates for a quantum dot array. Blind contacts create a dedicated control potential under multiple blind contact electrodes placed on metal layer using a standard FDSOI process technology. They function to control potential well depths independently for neighboring quantum dots and also simplify charge loading and Pauli blockade operation within the quantum dot array. The present invention furthermore allows to create two or more coupled quantum dots within one elongated active area. This permits the interconnection of two or more neighboring quantum dot chains using a conductive semiconductor well region. The blind contacts furthermore enable the implementation of charge sensors, precise precharge transistors, and linear and 2D quantum dot arrays.

Advantages of the mechanism of the present invention where the physical wells are merged and blind contact electrodes are added is to add another degree of freedom to the quantum structure. The blind contacts effectively modulate the potential profile in the well. The barrier/control gates still function to control the potential barrier between the quantum dots and therefore the tunneling between them, but the blind contacts aid in controlling the operation of the qubits.

Quantum computers are machines that perform computations using the quantum effects between elementary particles, e.g., electrons, holes, ions, photons, atoms, molecules, etc. Quantum computing utilizes quantum-mechanical phenomena such as superposition and entanglement to perform computation. Quantum computing is fundamentally linked to the superposition and entanglement effects and the processing of the resulting entanglement states. A quantum computer is used to perform such computations which can be implemented theoretically or physically.

Currently, approaches to building a quantum computer are divided into quantum simulation, quantum annealing, and adiabatic quantum computation. Digital quantum computers use quantum logic gates to do computation. Both approaches use quantum bits referred to as qubits.

Qubits are fundamental to quantum computing and are somewhat analogous to bits in a classical computer. Qubits can be in a |0> or |1> quantum state but they can also be in a superposition of the |0> and |1> states. When qubits are measured, however, they always yield a |0> or a |1> based on the quantum state they were in.

One challenge of quantum computing is isolating such nanoscopic particles, loading them with the desired information, letting them interact and then preserving the result of their quantum interaction. This requires relatively good isolation from the outside world and a large suppression of the noise generated by the particle itself. Therefore, quantum structures and computers operate at very low temperatures (e.g., cryogenic), close to the absolute zero kelvin (K), in order to reduce the thermal energy/movement/vibration of the particles to well below the energy/movement/vibration coming from their desired interaction. Current physical quantum computers, however, are very noisy and quantum error correction is commonly applied to compensate for the noise.

Most existing commercial quantum computers use superconducting structures to realize quantum interactions. Their main drawbacks, however, are the fact that superconducting structures are very large and costly and have difficulty in scaling to quantum processor sizes of thousands or millions of quantum-bits (qubits). Furthermore, they need to operate at few tens of millikelvin (mK) temperatures, that are difficult to achieve and where it is difficult to dissipate significant power to operate the quantum machine.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, a quantum structure, comprising a substrate, a substantially undoped layer fabricated on said substrate, raised source and drain fabricated on said undoped layer, one or more barrier gates fabricated on said undoped layer between said source and drain and operative to control a potential barrier between quantum dots on either side of said barrier gates, and one or more metal blind contacts disposed between said barrier gates and over quantum dots located between the barrier gates, said one or more blind contacts operative to provide additional dedicated control of the electrostatic potential profile and electric field of quantum dots between said barrier gates.

There is also provided in accordance with the invention, a quantum structure, comprising a substrate, a substantially undoped layer fabricated on said substrate, a quantum dot array (QDA) fabricated on said undoped layer, said QDA comprising a plurality of barrier gates fabricated on said undoped layer between said source and drain and operative to control a potential barrier between quantum dots located on either side of said barrier gates, a plurality of blind contacts, each blind contact disposed between a barrier gate and fabricated in a metal layer over a quantum dot, said blind contacts operative to provide additional control of the energy of a respective quantum dot, and a single electron transistor (SET) charge sensor fabricated in close proximity to said QDA on said undoped layer and operative to detect the presence or absence of charge in said QDA.

There is further provided in accordance with the invention, a quantum structure, comprising a substrate, a substantially undoped layer fabricated on said substrate, a quantum dot array (QDA) fabricated on said undoped layer, said QDA comprising a plurality of barrier gates fabricated on said undoped layer between said source and drain and operative to control a potential barrier between quantum dots located on either side of said barrier gates, a plurality of blind contacts, each blind contact disposed between a barrier gate and fabricated in a metal layer over a quantum dot, said blind contacts operative to provide additional control of the energy of a respective quantum dot, a plurality of sensors/injectors fabricated on said undoped layer and operative to inject and detect one or more particles in said QDA, and wherein said QDA and sensors/injectors are arranged in an 'H' shape configuration rotated 45 degrees from an alignment line.

There is also provided in accordance with the invention, a method of increasing gate density in a quantum integrated circuit, comprising providing a substrate, fabricated a substantially undoped layer on said substrate, fabricating a raised source and drain on said undoped layer, fabricating a plurality of barrier gates on said undoped layer between said source and drain, said plurality of barrier gates operative to control a potential barrier between quantum dots on either side of said barrier gates, fabricating a plurality of metal blind contacts between said barrier gates and over said quantum dots for providing additional dedicated control of the electrostatic potential profile and electric field of said quantum dots, and wherein fabrication of said blind contacts in a metal layer enables substantially decreased effective pitch between said barrier gates than would normally be possible to manufacture in a given process technology.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein.

DETAILED DESCRIPTION

Figure 1:
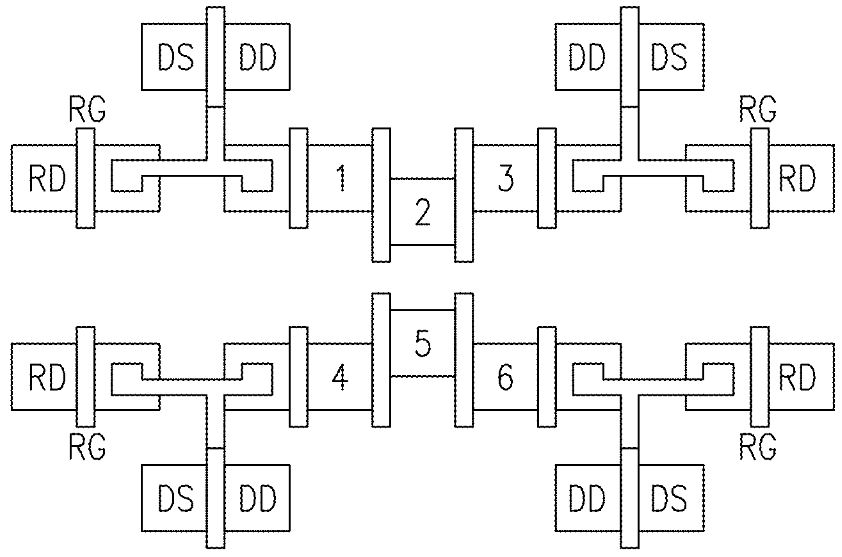
FIG. 1 is a diagram illustrating a first example double V quantum structure.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The following definitions apply throughout this document.

A quantum particle is defined as any atomic or subatomic particle suitable for use in achieving the controllable quantum effect. Examples include electrons, holes, ions, photons, atoms, molecules, artificial atoms. A carrier is defined as an electron or a hole in the case of semiconductor electrostatic qubit. Note that a particle's waveform may be split and be present in multiple quantum dots. Thus, a reference to a particle also includes split particles.

In quantum computing, the qubit is the basic unit of quantum information, i.e. the quantum version of the classical binary bit physically realized with a two-state device. A qubit is a two state quantum mechanical system in which the states can be in a superposition. Examples include (1) the spin of the particle (e.g., electron, hole) in which the two levels can be taken as spin up and spin down; (2) the polarization of a single photon in which the two states can be taken to be the vertical polarization and the horizontal polarization; and (3) the position of the particle (e.g., electron) in a structure of two qdots, in which the two states correspond to the particle being in one qdot or the other. In a classical system, a bit is in either one state or the other.

Quantum mechanics, however, allows the qubit to be in a coherent superposition of both states simultaneously, a property fundamental to quantum mechanics and quantum computing. Multiple qubits can be further entangled with each other.

A quantum dot or qdot (also referred to in literature as QD) is a nanometer-scale structure where the addition or removal of a particle changes its properties is some ways. In one embodiment, quantum dots are constructed in silicon semiconductor material having typical dimension in nanometers. The position of a particle in a qdot can attain several states. Qdots are used to form qubits and qudits where multiple qubits or qudits are used as a basis to implement quantum processors and computers. Note that a quantum dot also refers to a quantum well.

A quantum interaction gate is defined as a basic quantum logic circuit operating on a small number of qubits or qudits. They are the building blocks of quantum circuits, just like the classical logic gates are for conventional digital circuits.

A qubit or quantum bit is defined as a two state (two level) quantum structure and is the basic unit of quantum information. A qudit is defined as a d-state (d-level) quantum structure. A qubyte is a collection of eight qubits.

The terms control gate and control terminal are intended to refer to the semiconductor structure fabricated over a continuous well with a local depleted region and which divides the well into two or more qdots. These terms are not to be confused with quantum gates or classical FET gates.

Unlike most classical logic gates, quantum logic gates are reversible. It is possible, however, although cumbersome in practice, to perform classical computing using only reversible gates. For example, the reversible Toffoli gate can implement all Boolean functions, often at the cost of having to use ancillary bits. The Toffoli gate has a direct quantum equivalent, demonstrating that quantum circuits can perform all operations performed by classical circuits.

A quantum well is defined as a very small (e.g., typically nanometer scale) two dimensional area of metal or semiconductor that functions to contain a single or a small number of quantum particles. It differs from a classic semiconductor well which might not attempt to contain a small number of particles or/and preserve their quantum properties. One purpose of the quantum well is to realize a function of a qubit or qudit. It attempts to approximate a quantum dot, which is a mathematical zero-dimensional construct. The quantum well can be realized as a low doped or undoped continuous depleted semiconductor well partitioned into smaller quantum wells by means of control gates. The quantum well may or may not have contacts and metal on top. A quantum well holds one free carrier at a time or at most a few carriers that can exhibit single carrier behavior.

A classic well is a medium or high doped semiconductor well contacted with metal layers to other devices and usually has a large number of free carriers that behave in a collective way, sometimes denoted as a "sea of electrons."

A quantum structure or circuit is a plurality of quantum interaction gates. A quantum computing core is a plurality of quantum structures. A quantum computer is a circuit having one or more computing cores. A quantum fabric is a collection of quantum structures, circuits, or interaction gates arranged in a grid like matrix where any desired signal path can be configured by appropriate configuration of access control gates placed in access paths between qdots and structures that make up the fabric.

In one embodiment, qdots are fabricated in low doped or undoped continuous depleted semiconductor wells. Note that the term 'continuous' as used herein is intended to mean a single fabricated well (even though there could be structures on top of them, such as gates, that modulate the local well's behavior) as well as a plurality of abutting contiguous wells fabricated separately or together, and in some cases might apparently look as somewhat discontinuous when 'drawn' using a computer aided design (CAD) layout tool.

The term classic or conventional circuitry (as opposed to quantum structures or circuits) is intended to denote conventional semiconductor circuitry used to fabricate transistors (e.g., FET, CMOS, BJT, FinFET, etc.) and integrated circuits using processes well-known in the art.

The term Rabi oscillation is intended to denote the cyclic behavior of a quantum system either with or without the presence of an oscillatory driving field. The cyclic behavior of a quantum system without the presence of an oscillatory driving field is also referred to as occupancy oscillation.

The state of the quantum system is completely described by the wavefunction y, which for a qubit can be described as a vector on a Bloch sphere. For a multi-state system, the Hilbert space, which is a unitary state, can be used to represent it. Throughout this document, a representation of the state of the quantum system in spherical coordinates of Bloch sphere includes two angles q and j. The state vector Y in spherical coordinates can be described by these two angles. The angle q is between the vector Y and the z-axis and the angle j is the angle between the projection of the vector on the XY plane and the x-axis. Thus, any position on the sphere is described by these two angles q and j. Note that for one qubit Y representation is in three dimensions. For multiple qubits Y representation is in higher order dimensions.

A plunger gate is defined as a gate that functions to change the chemical potential of a quantum dot. A blind contact is a particular implementation of a plunger gate fabricated in one of the metal layers of the process.

Semiconductor Processing

Regarding semiconductor processing, numerous types of semiconductor material exist such as (1) single main atom types, e.g., Silicon (Si), Germanium (Ge), etc., and (2) compound material types, e.g., Silicon-Germanium (SiGe), Indium-Phosphide (InP), Gallium-Arsenide (GaAs), etc.

A semiconductor layer is called intrinsic or undoped if no additional dopant atoms are added to the base semiconductor crystal network. A semiconductor layer is doped if other atoms (i.e. dopants) are added to the base semiconductor crystal. The type of layer depends on the concentration of dopant atoms that are added: (1) very low doped semiconductor layers having high resistivity, i.e. n-type denoted by n−− and p-type denoted by p−−, having resistivities above 100 Ohm·cm; (2) low doped semiconductor layers, i.e. p-type denoted with p- and n-type denoted with n−, having resistivities around 10 Ohm·cm; (3) medium doped layers, i.e. p for p-type and n for n-type; (4) high doped layers, i.e. p+ and n+; and (5) very highly doped layers, i.e. p++ and n++.

Note that introducing dopants in a semiconductor crystal likely results in defects that introduce energy traps that capture mobile carriers. Traps are detrimental for semiconductor quantum structures because they capture and interact with the quantum particles resulting in changed states and decoherence of the quantum information. For realizing semiconductor quantum structures undoped semiconductor layers are preferred.

Classic electronic devices use mostly low, medium, high and very highly doped semiconductor layers. Some layers are ultra-highly doped to behave as metals, such as the gate layer.

Semiconductor processing is typically performed on large semiconductor wafers which have a given thickness for mechanical stability. Circuitry is fabricated on a very thin layer on the top of the wafer where the unused thick portion of the wafer is termed the substrate. In a bulk process, devices are fabricated directly in the semiconductor body of the wafer.

An insulating layer (e.g., oxide) isolates from the substrate the devices used to create circuitry. Semiconductor on insulator process, e.g., silicon on insulator (SOI), uses a layer of insulator (e.g., oxide) between the thin top semiconductor layer where devices are realized and the substrate.

To improve circuit performance, the wafer is processed such that the devices are realized on top of an insulator substrate, e.g., semiconductor-on-glass, semiconductor-on-organic material, semiconductor-on-sapphire, etc.

Alternatively, the semiconductor substrate is eliminated and replaced with a nonelectrical conducting material such as a polymer or other material compatible with a semiconductor process (e.g., substrate-replacement processes). Substrate replacement in realizing semiconductor quantum structures significantly reduces or eliminates substrate decoherence.

High resistivity (i.e. very low doped) substrates are the next best substrate choice for semiconductor quantum structures. Although intrinsic substrates are also suitable for semiconductor quantum structures, there are specific limitations that prevent the use of intrinsic substrates.

Thus, in accordance with the invention, semiconductor quantum structures can be realized in (1) bulk processes, (2) SOI processes, (3) substrate replacement processes, or (4) semiconductor on other materials.

Regarding processing, (1) planar processes may be used where layers have predominantly one orientation, i.e. horizontal; and (2) three-dimensional processes (3D) allow layers with both horizontal and vertical orientation, realizing more complex 3D structures. It is appreciated that although layers are shown in the figures as rectangular prisms for simplicity, physically the layers have more complicated structures. For example, corners are often rounded and distortions are present due to the masking process. In depth dimension, layers tend to have a trapezoidal shape instead of the ideal rectangular one. The semiconductor quantum structures of the present invention can be realized in either planar or 3D processes.

In one embodiment, the quantum system of the present invention comprises a quantum dot array having a plurality of semiconductor quantum structures. A silicon-on-insulator (SOI) or fully depleted SOI (FD-SOI) process may be used in which the substrate is low doped (i.e. high resistivity) and is isolated from the quantum device with a buried oxide layer (BOX). This reduces the decoherence of the quantum particle. In one embodiment, the semiconductor quantum device employs tunneling through the local depleted region. In another embodiment, tunneling occurs through the oxide layer between the semiconductor well (low doped or undoped) and a partially overlapping gate and oxide layer. The active layer is isolated using oxide from adjacent structures, e.g., shallow trench isolation (STI), reducing further the quantum particle decoherence.

Note that the substrate may comprise (1) a semiconductor, (2) silicon on insulator (SOI) substrate, where the substrate comprises sapphire, glass, organic material, etc., (3) an insulating substrate replacement, for example, sapphire, glass, organic material, plastic, polymer, etc., or (4) any other insulating material compatible with a semiconductor process.

Note that regardless of the substrate used, the quantum structure must be electrically isolated from the substrate for the structure to operate properly. Otherwise, the quantum particle may escape thus preventing quantum operation of the structure.

Several ways to electrically isolate the quantum structure include: (1) utilizing an SOI or low doped substrate where the oxide layer electrically isolates the quantum structure from the substrate; (2) using substrate replacement such as an insulator material, e.g., polymer, glass, etc.; and (3) using a fixed depletion region, as the quantum particle can tunnel only through a relatively narrow insulating region such as very thin oxide or a thin depletion region. If the depletion region is too wide, the quantum particle is prevented from traveling. Note that this last option can be fabricated using bulk processes.

The quantum operation is controlled by the gate located over the tunneling path that modulates the barrier created by the local depletion region.

Blind Contact Gates

Figure 2:
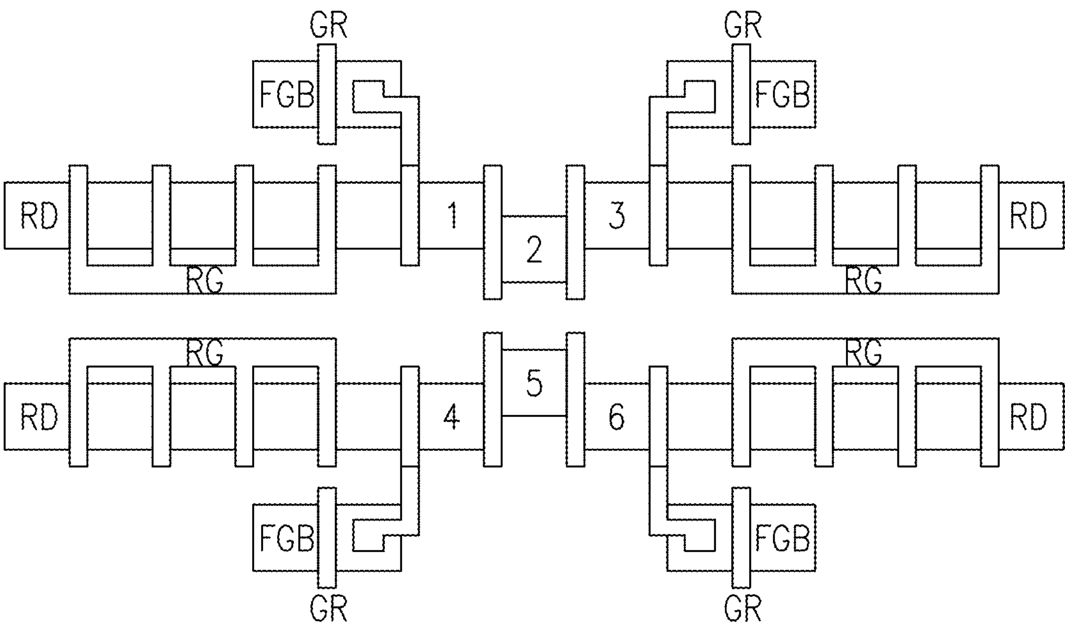
FIG. 2 is a diagram illustrating a second example double V quantum structure.
Figure 3:
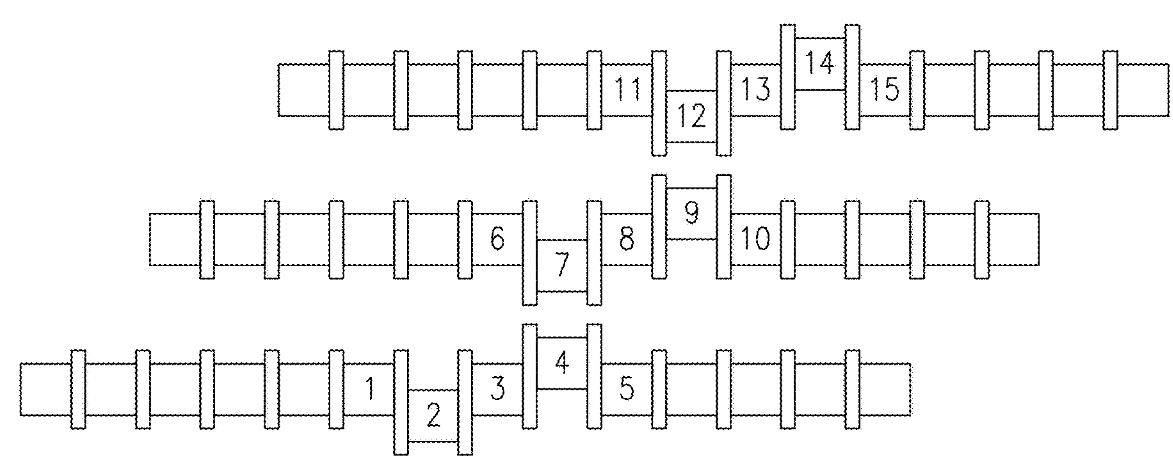
FIG. 3 is a diagram illustrating an example quantum dot array.
Figure 4:
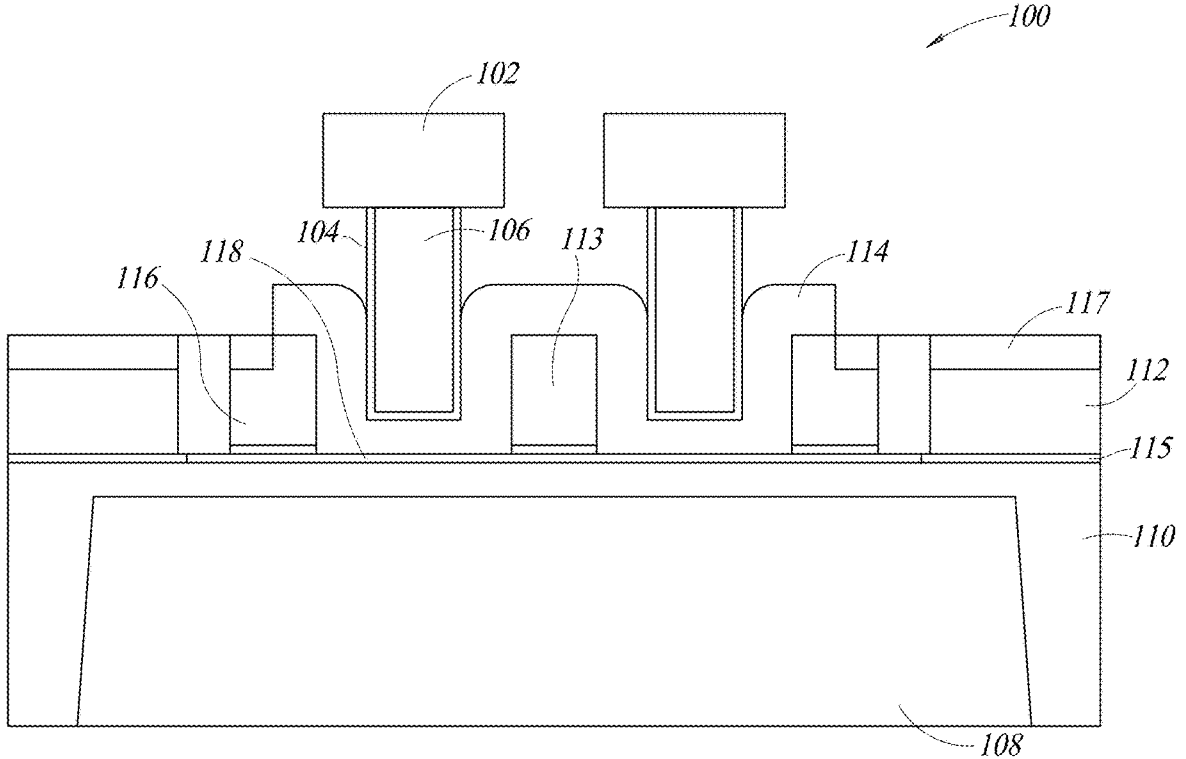
FIG. 4 is a diagram illustrating a first example quantum structure incorporating blind contacts.
Figure 12:
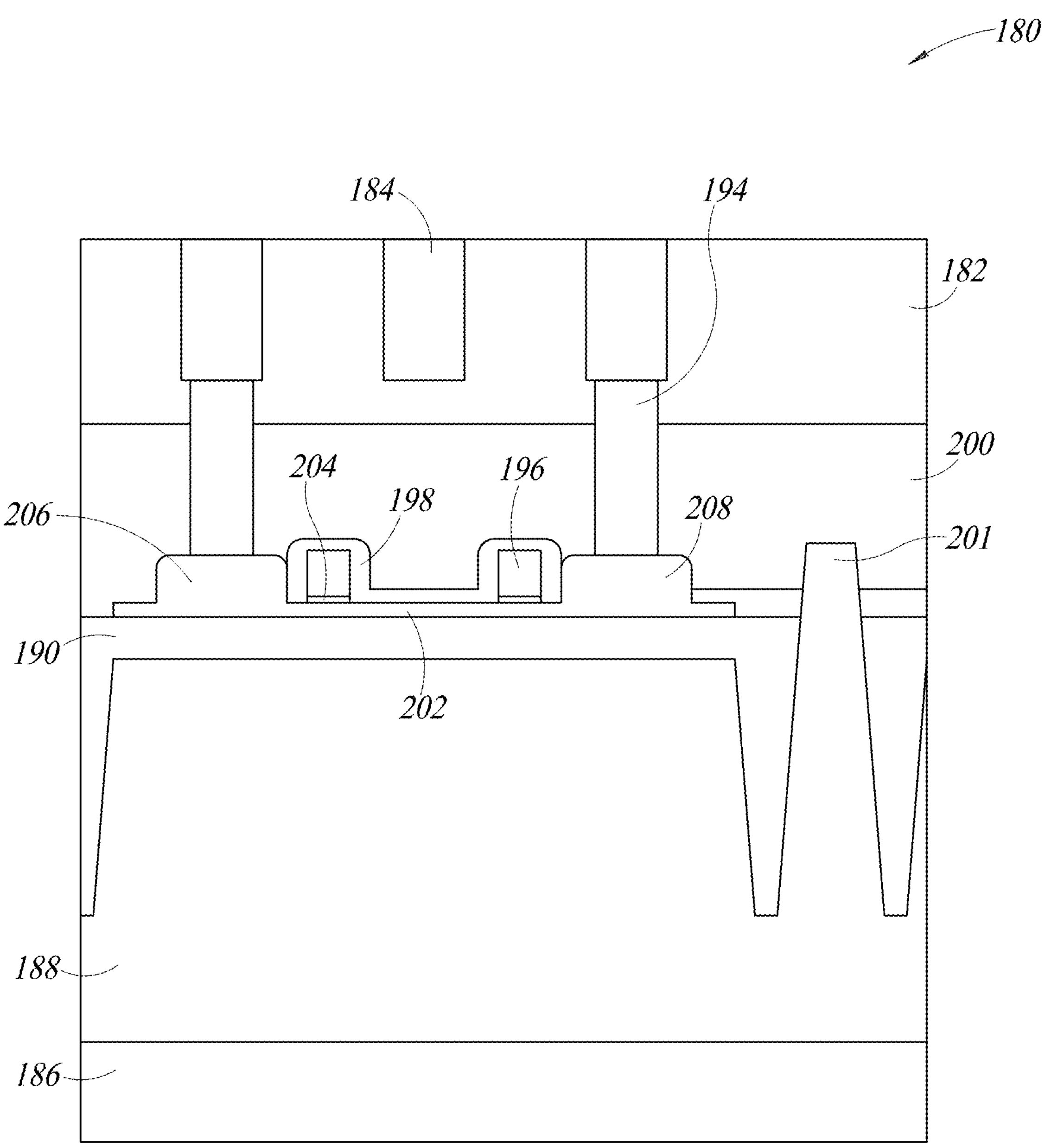
FIG. 12 is a diagram illustrating a cross sectional view of a single electron transistor incorporating a blind contact.
Figure 16:
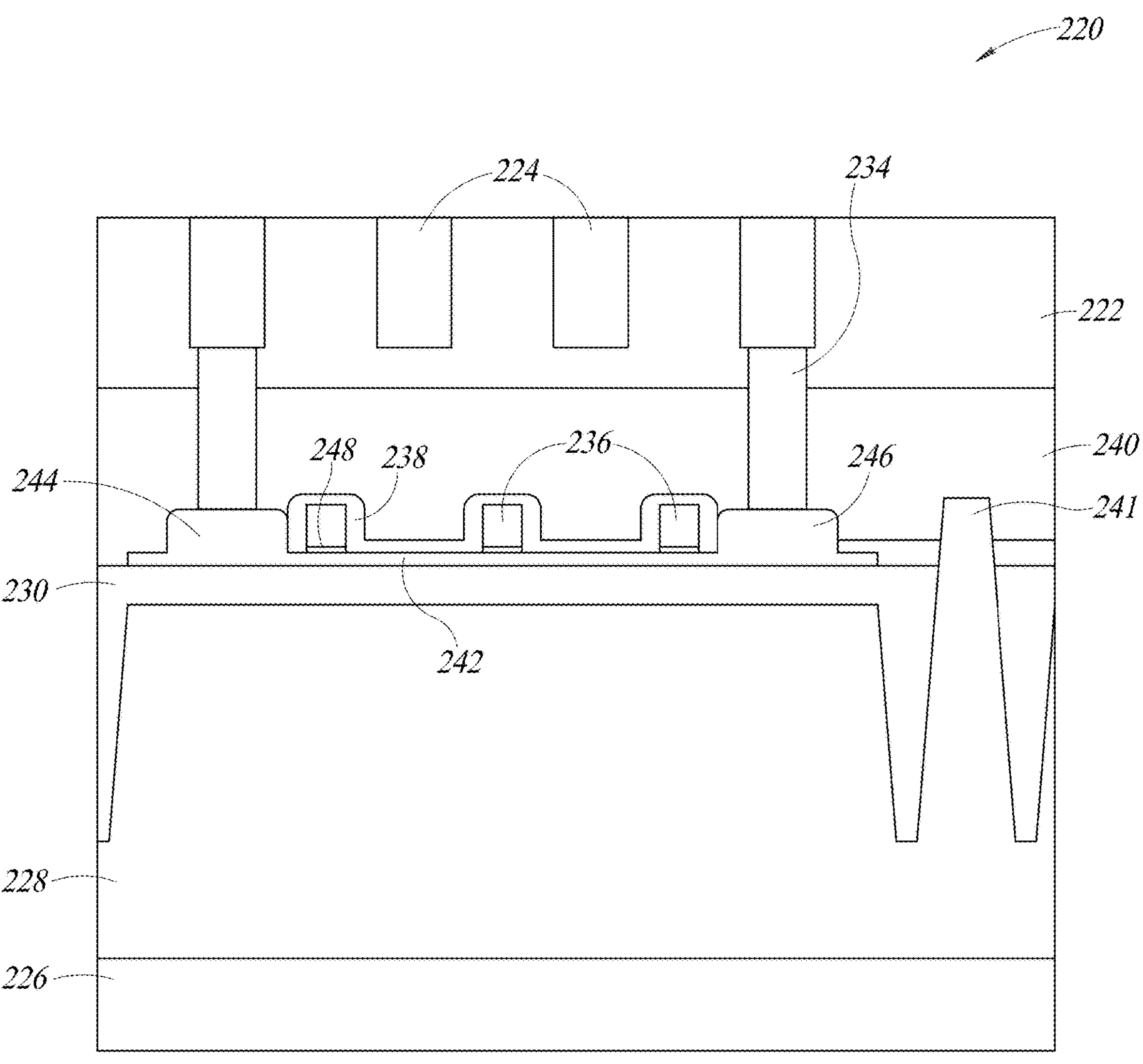
FIG. 16 is a diagram illustrating a cross sectional view of a two quantum dot array incorporating blind contacts.

Diagrams illustrating example double V quantum structures are shown in FIGS. 1, 2, and 3. In the structures shown in these figures, there is no path for current to flow between the interactive quantum dot locations. In order to improve controllability of the qubit structures and provide finer electrostatic potential profile resolution, the present invention adds one or more blind contact electrodes to the quantum structures as shown in FIGS. 4, 12, and 16, for example. In one embodiment, the regions of the interactive quantum dots are merged into a single well (or "active") region and multiple blind contact electrodes are fabricated in the merged region. In the examples shown and described infra, two blind contact electrodes are placed within the merged qdot region. The control gates to either side of the merged well are continuous and unbroken. Prior art structures in contrast have broken polysilicon gate structures and/or one or more a postprocessing steps.

A diagram illustrating a first example quantum structure incorporating blind contacts is shown in FIG. 4. The quantum structure, generally referenced 100, comprises a bulk silicon back gate (either n- or p-doped) 108, buried oxide (BOX) layer 110, substantially undoped channel 118, polysilicon barrier or control gates 113, high-k gate oxide 116, n- or p-doped raised source drain 112, similarly doped channel 115, silicide (NiSi) 117, tungsten contact fill 106, contact liner (TiN) 104, metal blind contact (e.g., copper) 102, and silicon nitride 114. In terms of processing technology, the present invention exploits the existing stage of the process similar to the one used for vias that connect raised source or drain but skips the step of raising the source and drain.

In order to improve control of the qubit structures and provide finer resolution, the invention provides one or more blind contact electrodes 102 that are added to the quantum structures. The blind contacts are an implementation of a plunger gate which is a gate that functions to change the chemical potential of a quantum dot. The advantage of merging the physical wells and adding blind contact electrodes is to add another degree of freedom to the quantum structure. The blind contacts function to effectively modulate the potential profile in the quantum dot. The barrier/control gate still functions to control the potential barrier between the quantum dots but the blind contacts aid in controlling the operation of the qubits. For example, when the blind contact electrode is positive, the electron is attracted and will likely be under the electrode. A negative potential on the electrode will repel the electron. In either case, the electron is distributed over the longer quantum dot area.

In one embodiment, a blind contact is created between barrier gates using, for example, a silicide block mask to stop contact on a silicon nitride layer. Dedicated contact etching can be used with a separate mask or standard contact masks can be used with correct selective etch. The top layer can be conventional silicide block mask material, e.g., silicon nitride or other materials when better selectivity is needed.

Note that each blind contact electrode has a certain electrical potential applied to it. A capacitive digital to analog converter (CDAC) or RFCDAC (not shown) functions to generate the required voltage that is applied. Each electrode may have its own dedicated CDAC or groups of electrodes may share a CDAC and have a common potential applied to them. In one embodiment, one or more blind contacts are held at a constant voltage and the barrier gate potential is varied to control the tunnelling barrier between quantum dots. An advantage of the invention is that barrier control is now made easier by the addition of the blind contacts.

With reference to the cross section of the quantum structure, the silicide layer functions to stop the blind contact electrode before it reaches the silicon. It is noted that the blind contact electrode is not a gate since it does not gate anything, but rather either attracts or repels.

Figure 5:
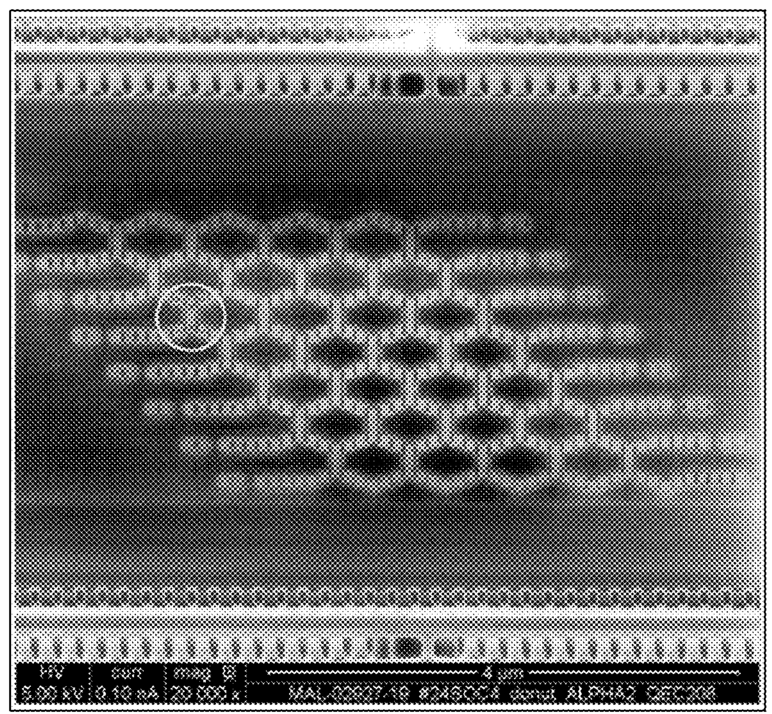
FIG. 5 is a diagram illustrating a first example quantum dot array incorporating blind contacts.
Figure 6:
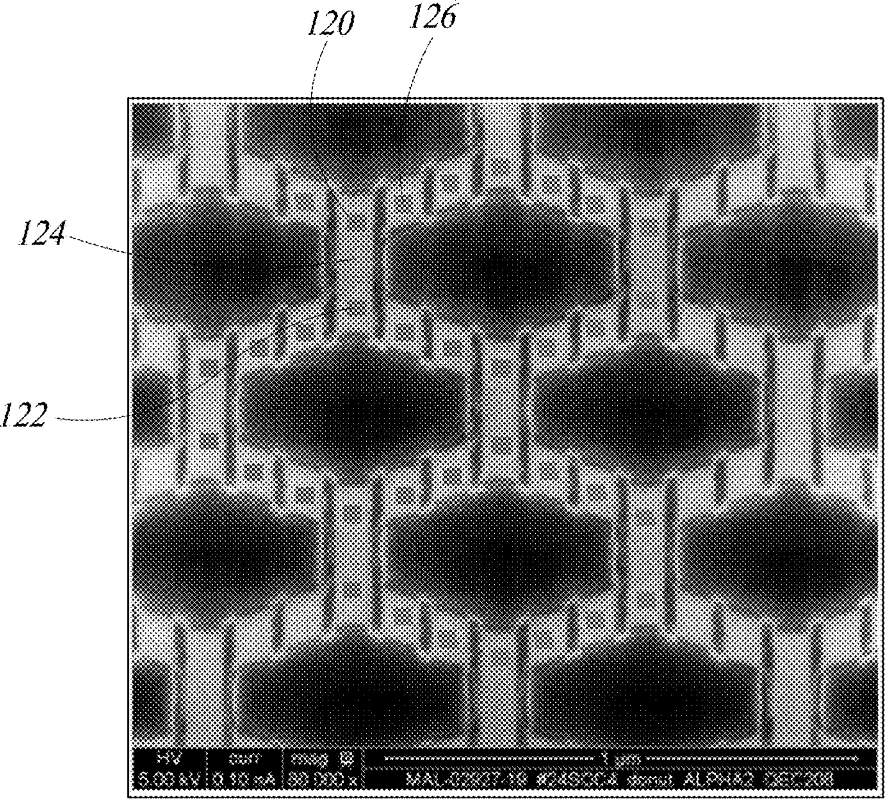
FIG. 6 is a diagram illustrating the first example quantum dot array of FIG. 5 in more detail.

A diagram illustrating a first example quantum dot array incorporating blind contacts is shown in FIG. 5. A diagram illustrating the first example quantum dot array of FIG. 5 in more detail is shown in FIG. 6. Placing multiple blind contact electrodes to effectively divide the merged well 124 into two wells. For example, quantum dots 120 and 122 are merged and the blind contact electrodes effectively split the larger well 124 into two wells. The advantage of merging the wells and adding blind contact electrodes is to add another degree of freedom to the quantum structure.

A localized electric field is used to localize two electrons in the same area without merging them together and no additional gate between 120 and 122 is needed. Note that cross connections where, for example, an electron can bypass 120 and go directly from 122 to 126, are possible if appropriate control voltages are applied to the gates and blind contact electrodes which provide improved flexibility and additional freedom to move electrons around at will.

Thus, the addition of blind contacts adds an additional 'knob' of control to the qubit structure in addition to the barrier/control gate and allows for easier control of the operation of the qubit. It is noted that the blind contact electrode does not function as a barrier/control polysilicon (PC) gate. The barrier/control gate continues to control the raising and lowering of the barrier for tunneling. The blind contacts in the device described in FIGS. 5 and 6 function to control the energy of the quantum dot.

Thus, the addition of blind contact electrodes in the common undoped region (of a thin intrinsic silicon material layer) provides limited isolation but with coupling. The voltage on the electrodes keeps the electrons separate. The field between the barrier/control gates decays away from the electrodes.

Figure 7:
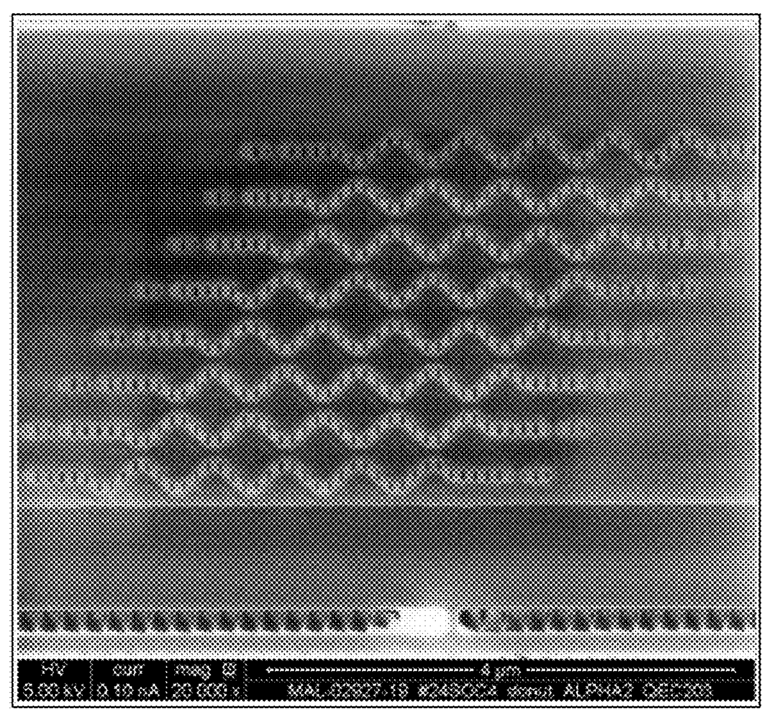
FIG. 7 is a diagram illustrating a second example quantum dot array incorporating blind contacts.
Figure 8:
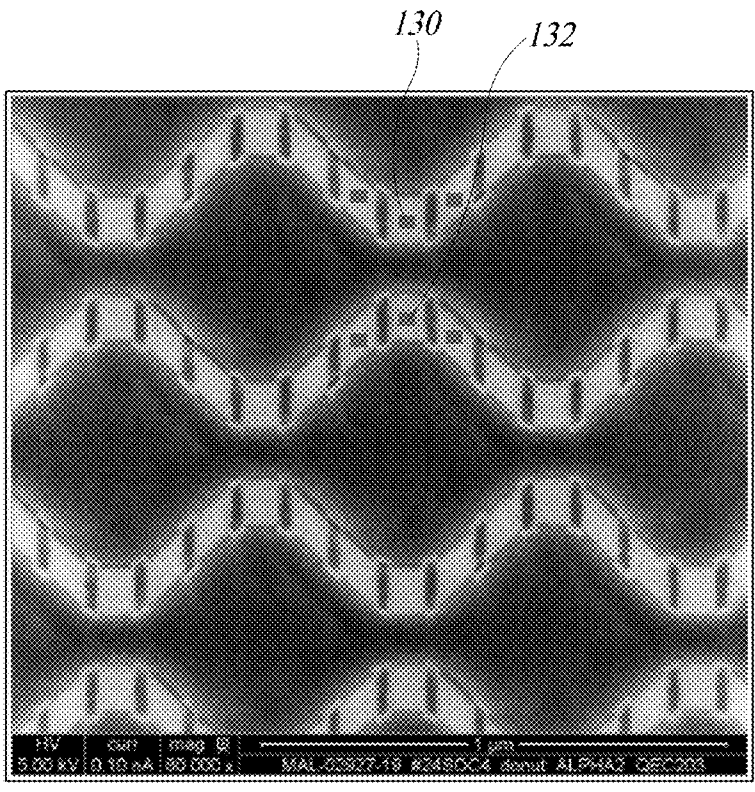
FIG. 8 is a diagram illustrating the second example quantum dot array of FIG. 7 in more detail.

A diagram illustrating a second example quantum dot array incorporating blind contacts is shown in FIG. 7. A diagram illustrating the second example quantum dot array of FIG. 7 in more detail is shown in FIG. 8. It is possible also to put blind contacts 130 and 132 in structures that have a distance between dots. Adding blind contacts still allows fine control of the energies of individual quantum dots. In this case, the distance between nearby quantum dot arrays (i.e. rows) is less than in merged quantum dots described supra (FIGS. 5 and 6).

The quantum system shown is arranged in multiple staggered rows of quantum dots one atop the other. The quantum dots are separated from each other by imposers, constructed as metal or polysilicon control gates, which control the amount of tunneling therebetween. In one embodiment, the rows are staggered to meet particular process design rules. Each row includes a linear array of quantum dots arranged in alternating upright and inverse 'V' configurations. This provides close interaction between several qdots in neighboring rows. Note that the qdots may be fabricated using any suitable semiconductor process.

Each row in the quantum system comprises a plurality of quantum dots separated by a gate (also known as imposer). Note that the qdots shown in this quantum system and other quantum systems described herein may be fabricated using any suitable process including planar or 3D using tunneling through depletion or tunneling through oxide. Several processes suitable for use in fabricating quantum systems are described in detail in U.S. Pat. No. 10,903,413, entitled "Semiconductor Process Optimized for Quantum Structures," incorporated herein by reference in its entirety.

Figure 9:
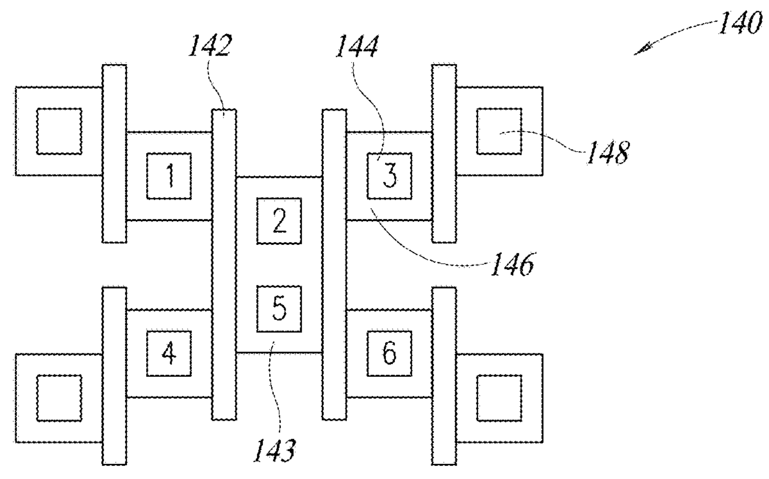
FIG. 9 is a diagram illustrating an example double V quantum structure incorporating blind contacts.

A diagram illustrating an example double V quantum structure incorporating blind contacts is shown in FIG. 9. The double V shape structure, generally referenced 140, comprises n-type raised source drain and contact 148, substantially undoped active area 146, blind contacts 144, and polysilicon barrier/control gates with high-k dielectric 142. In this example structure, quantum dots 2 and 5 are merged and the blind contact electrodes split the larger well 143 into two wells.

Figure 10:
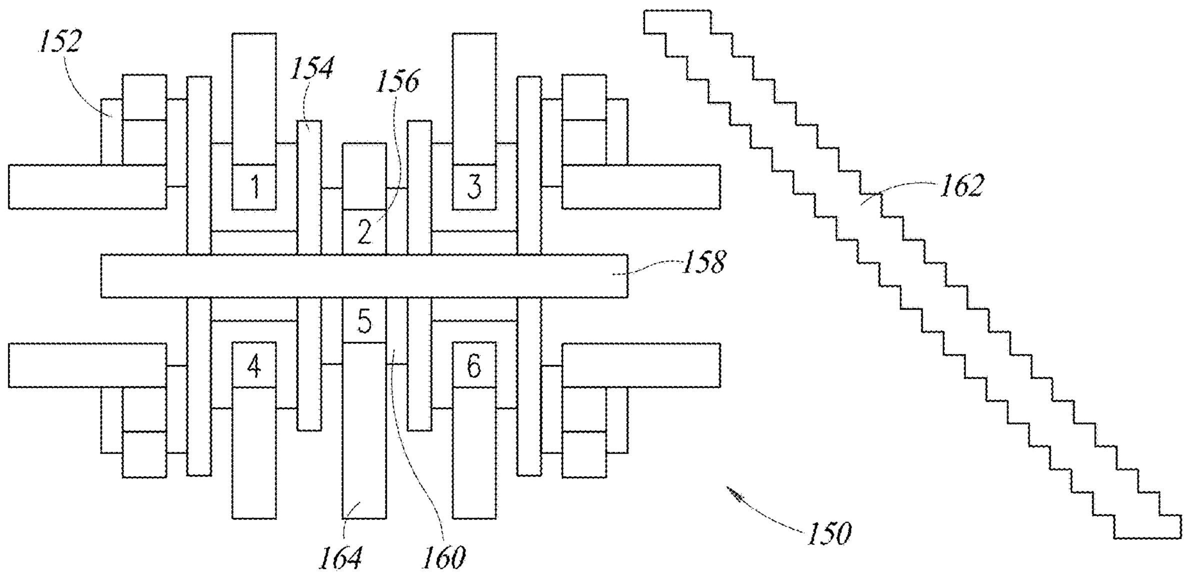
FIG. 10 is a diagram illustrating an example double V quantum structure incorporating blind contacts and an electronic spin resonance (ESR) line.

A diagram illustrating an example double V quantum structure incorporating blind contacts and an electronic spin resonance (ESR) line is shown in FIG. 10. The double V structure, generally referenced 150, comprises n-type raised source drain and contact 152, substantially undoped active area 160, blind contacts 156, polysilicon barrier/control gates with high-k dielectric 154, ESR line 158, field gradient line 162, and metal 164 that connect the blind contacts. The ESR line 158 is utilized for spin qubit experiments. The metal layer 164 contains the contacts to the terminals (i.e. sources, drains, blind contacts, and barrier gates) which are connected to individual CDACs (not shown). The metal strip placed in the Metal-2 layer (M2) functions as ESR line that is used for the generation of the ac magnetic field pulses that rotate spins in quantum dots 1 through 6. The strip 162 placed in the Cl layer is a magnetic detuning line that is utilized for the addressability of qubits.

Figure 11:
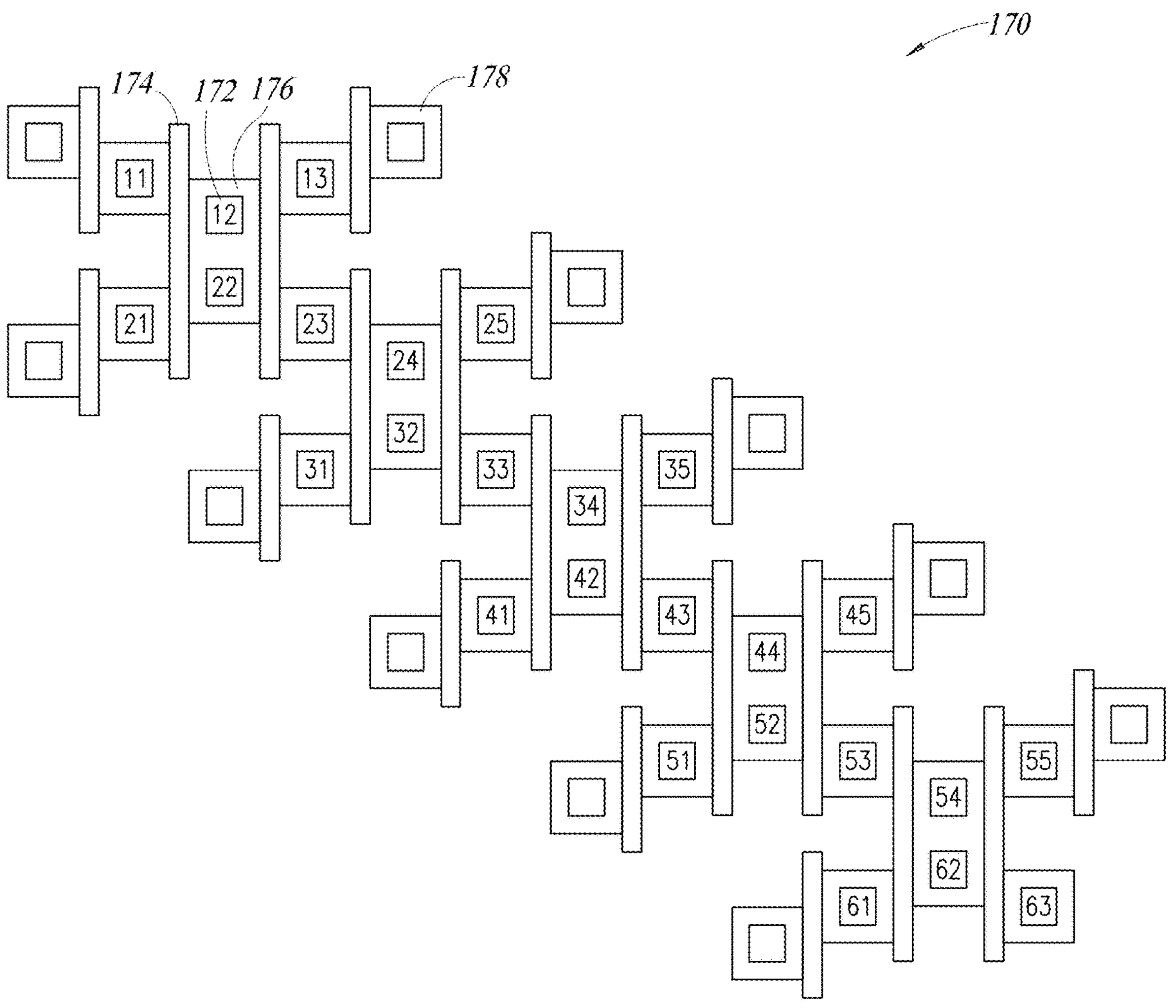
FIG. 11 is a diagram illustrating an example 2D quantum dot array incorporating blind contacts.

A diagram illustrating an example 2D quantum dot array incorporating blind contacts is shown in FIG. 11. The quantum dot array, generally referenced 170, comprises n-type raised source drain and contact 178, substantially undoped active area 176, blind contacts 172, polysilicon barrier/control gates with high-k dielectric 174. Note that this example QDA incorporates individual control of the quantum dots. In addition, the interacting quantum dots in close proximity to each other (e.g., quantum dots 12 and 22) are merged and the blind contact electrodes split each larger well into two wells.

A diagram illustrating a cross sectional view of a single electron transistor incorporating a blind contact is shown in FIG. 12. The quantum structure, generally referenced 180, comprises an n-doped well 186, p-doped well back gate 188 with backgate potential applied to 201, buried oxide (BOX)

layer 190, substantially undoped active silicon channel 202, polysilicon barrier/control gates 196, high-k gate oxide 204, silicon nitride (SiN) 198, raised source drain 206, 208, silicide (NiSi) 194, metal blind contact (e.g., M1 copper) 184, silicon nitride spacer 182, and silicon nitride foam (low-k dielectric) 200.

The quantum dot is formed in a fully depleted channel between the two gates 196 that in this case regulate the tunneling from source and drain (i.e. they are barrier gates). The blind contacts of the present invention function to create an additional dedicated control potential under one or multiple contact electrodes placed on a metal layer between the barrier gates, and therefore have a function of a plunger gate. Their function is to control potential well depths independently for neighboring quantum dots and to also simplify charge loading and Pauli blockade operation within the quantum dot array. The blind contacts furthermore enable the implementation of charge sensors, precise precharge transistors, and linear and 2D quantum dot arrays.

Note that the metal blind contacts do not require any modifications of the standard commercial FDSOI process. They can be placed between barrier gates the same way as the contacts used for the connection between raised source drains and other metallic layers and therefore are agnostic to the position of polysilicon (PC) gates. In addition, any metal layer may be used but the closer the blind contact is to the active channel, the more effective its electric field, e.g., M1 versus higher metal layers.

Moreover, the blind contacts added to the quantum structure avoids the prior art limitation of the polysilicon gate pitch that is available for the process. In one embodiment, the blind contacts are placed at the M1 (Metal 1) layer in FDX-22 process by GlobalFoundaries or at different metal layers depending on the particular implementation such as M0, M1, M2, M3 or any other layers. In addition, the blind contacts of the present invention may be realized using other available processes such as the FinFET process by Taiwan Semiconductor Manufacturing Company (TSMC). A key advantage of the blind contacts of the present invention is that fabricating them does not require any postprocessing of the wafer as is the case with prior art plunger gates. The actual implementation of the blind contacts is agnostic to the particular placement of polysilicon gates.

The use of a metal blind contact control allows decreased effective gate pitch (i.e. increased density) than would otherwise be possible to manufacture in a given process technology. As process geometries improve (i.e. decrease in size) the benefits of the use of blind contacts will increase.

In one embodiment, one or more blind contacts are placed within an active area enclosed by barrier gates. By placing more than one blind contact, multiple quantum wells are created within a single active area. Providing electric fields from neighboring barrier gates with defined well heights between common active quantum wells enables implementing multiple coupled quantum dots. Note that multiple blind contacts may be placed within an active area 'sandwiched' by barrier gates at both ends of the group of blind contacts.

To enable employment of a standard process, the metal blind contacts are placed above the active channel and the tungsten contacts in FIG. 4 are eliminated. Since the contact 184 is approximately 100 nm above the active channel, the electric field it creates is much weaker than one created by barrier/control gates 196, back gate 188 or blind contacts described in FIG. 4. Note that the blind contacts 184 contribute to the lever arm, i.e. how the energy states of electrons in quantum dots change with the potential applied to the blind contact. The lever arm indicates how much the energy levels of the quantum dot shift for a given change in barrier gate and blind contact voltage. It is a parameter in controlling the behavior of quantum dots in various quantum devices. The structure described in FIGS. 12 and 13 use polysilicon gates 196 to tune the tunnelling rate from source and drain to the quantum dot, metal blind contact 184 to control the energy of quantum dot shown in FIG. 15, and backgate 188 to tune the overall energy (i.e. barriers and wells) in the channel to correct configuration as shown in FIG. 14. It is noted that with the addition of blind contacts to the quantum structure, each quantum dot now has four degrees of freedom, including (1) source and drain potentials, (2) left and right barrier/control gates for regulating the tunnelling rate between the source and drain and the quantum dots, (3) back gate bias to provide coarse tuning of the shape of the quantum dot, and (4) one or more Metal blind contacts to fine tune the quantum dot energy without requiring of the barrier potentials.

Figure 13:
FIG. 13 is a diagram illustrating a top down view of a single electron transistor incorporating a blind contact.
Figure 13:
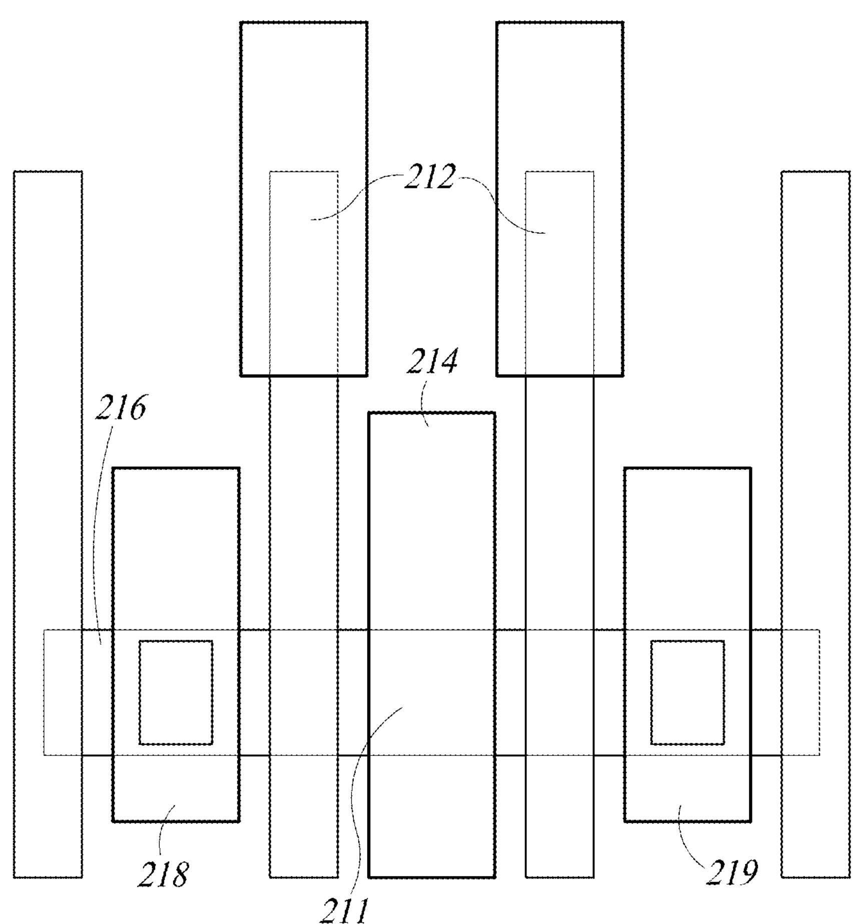
Figure 14:
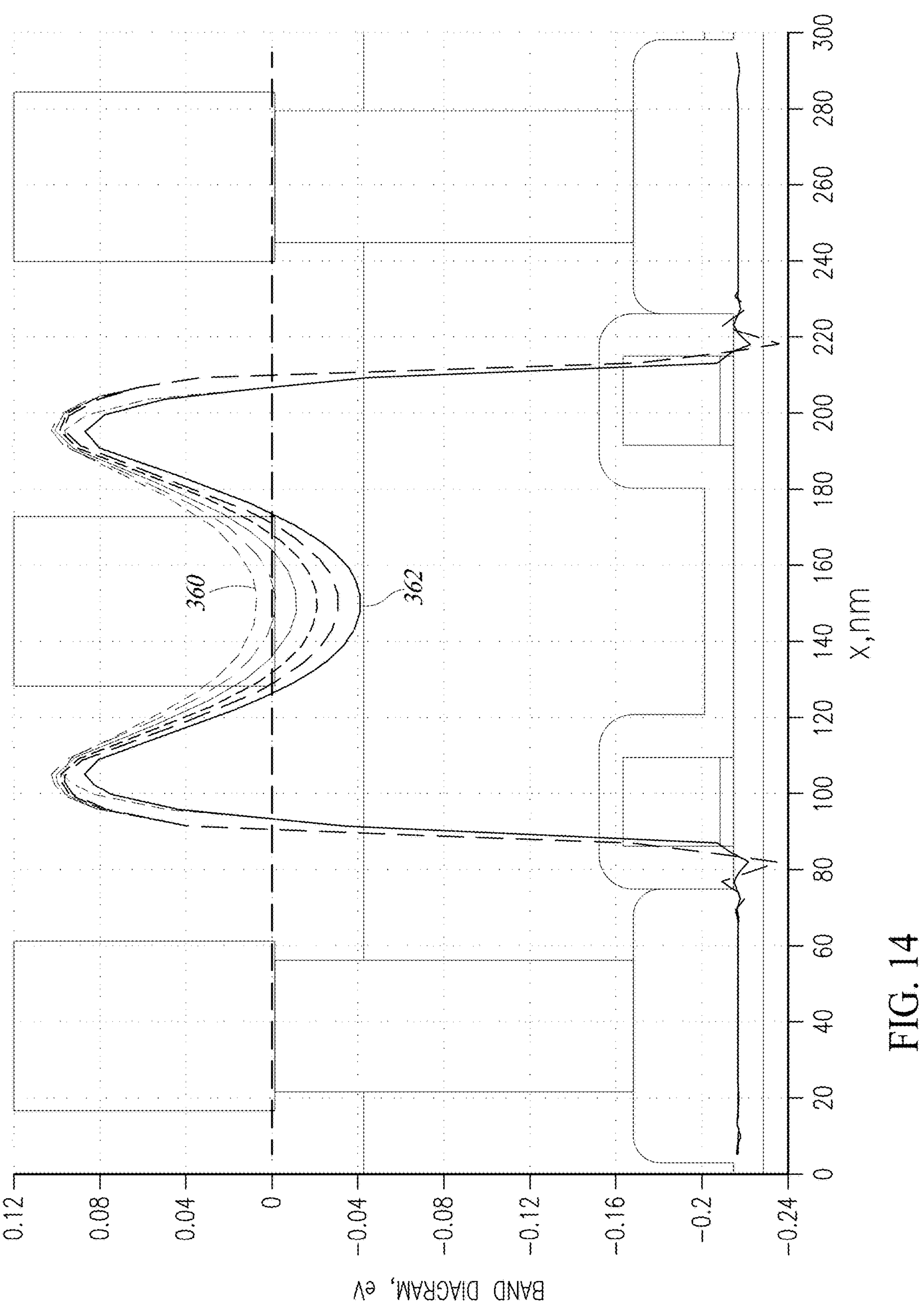
FIG. 14 is a diagram illustrating the effect of back gate bias on the conduction band edge in a single electron transistor.

A diagram illustrating a top down view of a single electron transistor incorporating a blind contact is shown in FIG. 13. The example single electron transistor (SET), generally referenced 210, comprises barrier gates 212, blind contact 214, source 218, drain 219, and active silicon channel 216. The SET shown can function as a charge sensor/detector in a QDA. In one embodiment, the charge sensor includes a single electron transistor (SET). The quantum dot 211 is formed in the channel 216 between two barrier gates 212 and its energy is controlled by the potential applied to the blind contact.

A diagram illustrating the effect of back gate bias on the conduction band edge in a single electron transistor is shown in FIG. 14. The SET structure is superimposed on the graph to show perspective. The set of traces show the effect the back gate bias has on the conduction band edge in a channel when the blind contact voltage is zero. The positive back gate voltage forms the quantum well between the barrier gates, but also modifies the barrier gates between the source/drain and the well. This step is used to roughly tune all quantum dots in an array (or a single dot in SET). Since the back gate is much closer to the active channel, its effect is larger than the influence of the blind contact.

Figure 15:
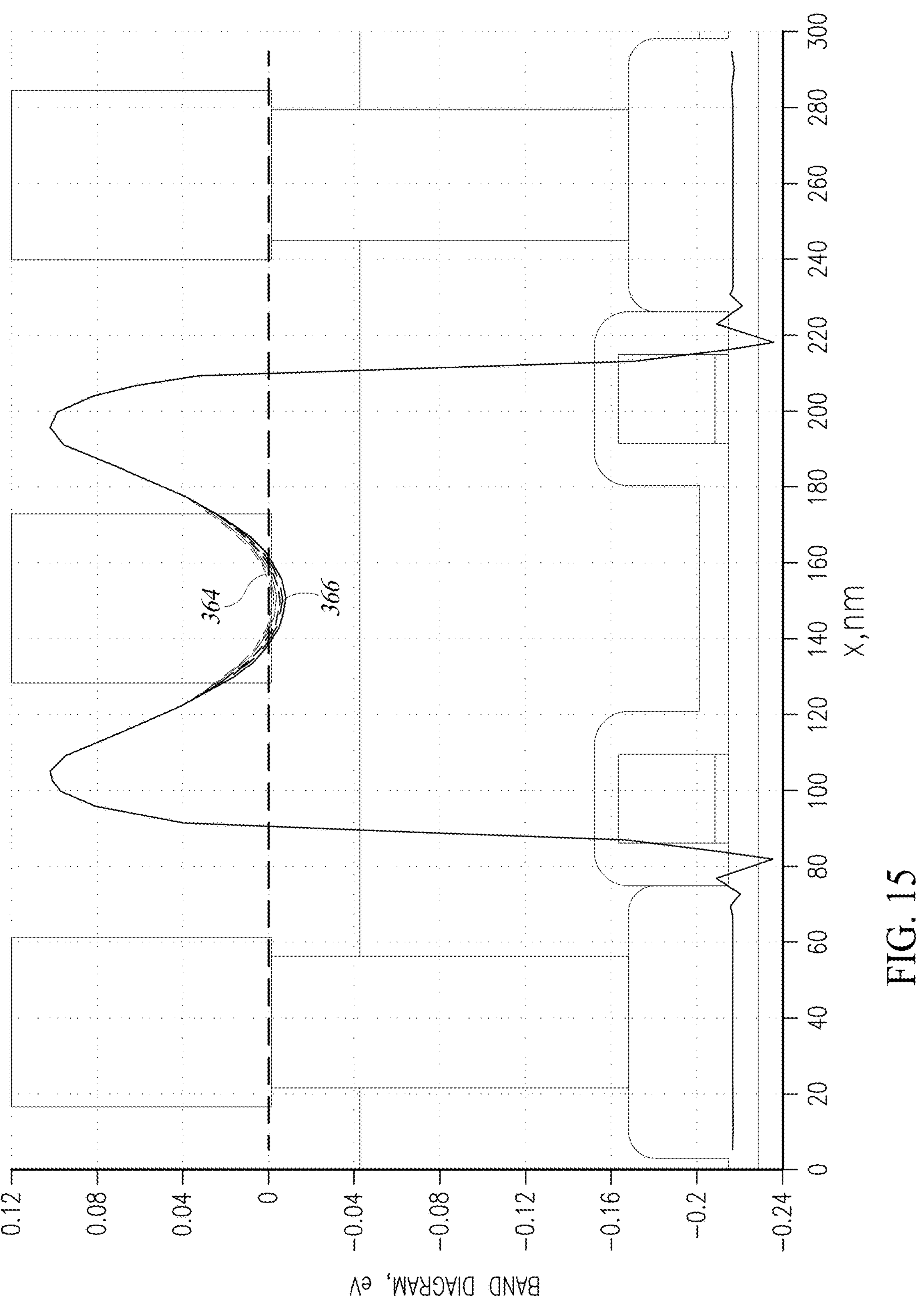
FIG. 15 is a diagram illustrating the effect of the blind contact on the conduction band edge of a single electron transistor.

A diagram illustrating the effect of the blind contact on the conduction band edge of a single electron transistor is shown in FIG. 15. The SET structure is superimposed on the graph to show perspective. The set of traces show the effect the blind contact has on the conduction band edge in a channel. Application of voltage to the M1 blind contact shifts the energy of the electron in a quantum well. This technique allows use of the SET as a charge sensor in the QDA. Note that if the quantum device is in a state where it conducts (i.e. the Fermi levels in the source and drain are aligned with the energy of the electron in the quantum dot), then any change placed close to that quantum dot will modify the energy of the well and that will cause the current flow to cease.

A diagram illustrating a cross sectional view of a two quantum dot array incorporating blind contacts is shown in FIG. 16. Note that the quantum structure of FIG. 12 can be extended to create linear quantum dot arrays of having any desired length (QDA of two quantum dots shown in this example). The quantum structure, generally referenced 220, comprises an n-doped well 226, p doped well back gate 228, buried oxide (BOX) layer 230, substantially undoped active silicon channel 242, polysilicon barrier/control gates 236, high-k gate oxide 248, silicon nitride (SiN) 238, raised source drain 244, 246, silicide (NiSi) 234, metal blind contact (e.g., copper) 224, silicon nitride spacer 222, and silicon nitride foam (low-k dielectric) 240.

The barrier gates 236 in this case are used for control of the tunnelling rates, while the blind contacts 224 modify the energies of quantum dots. The back gate 228 is common for the whole array and serves as the initial turning of quantum dots similarly to the case of a charge sensor with a potential applied to 241.

The quantum dots in this example structure are situated between the barrier gates and controlled by the barrier gates and blind contacts. The precharge phase of the quantum dot array is achieved by the connection of the precharge transistors to the left and right source/drains. This technique allows the array to be charged and measure how many electrons are placed on the quantum dots. Placing the charge sensors along the quantum dot array can measure at least every second quantum dot state.

Note that the precise precharge device of the quantum structure also can be used as a charge sensor. In one embodiment, the quantum dot is formed between the barrier gate applying the positive gate-source voltages and either the negative common mode (average between the source and drain voltages), or the positive back gate voltage. After the quantum well is formed, the metal blind contact to source voltage can vary the energy of the bottom of the potential well. In one embodiment, the voltage applied to the blind contact varies from −1.5 V to 1.5 V. This allows a fully controllable quantum dot to be constructed that can be used as a precise single electron precharge device. If the device is capacitively connected to a quantum dot array, it can be used as a single-electron charge sensor.

Figure 17:
FIG. 17 is a diagram illustrating a top down view of a two quantum dot array incorporating blind contacts.
Figure 17:
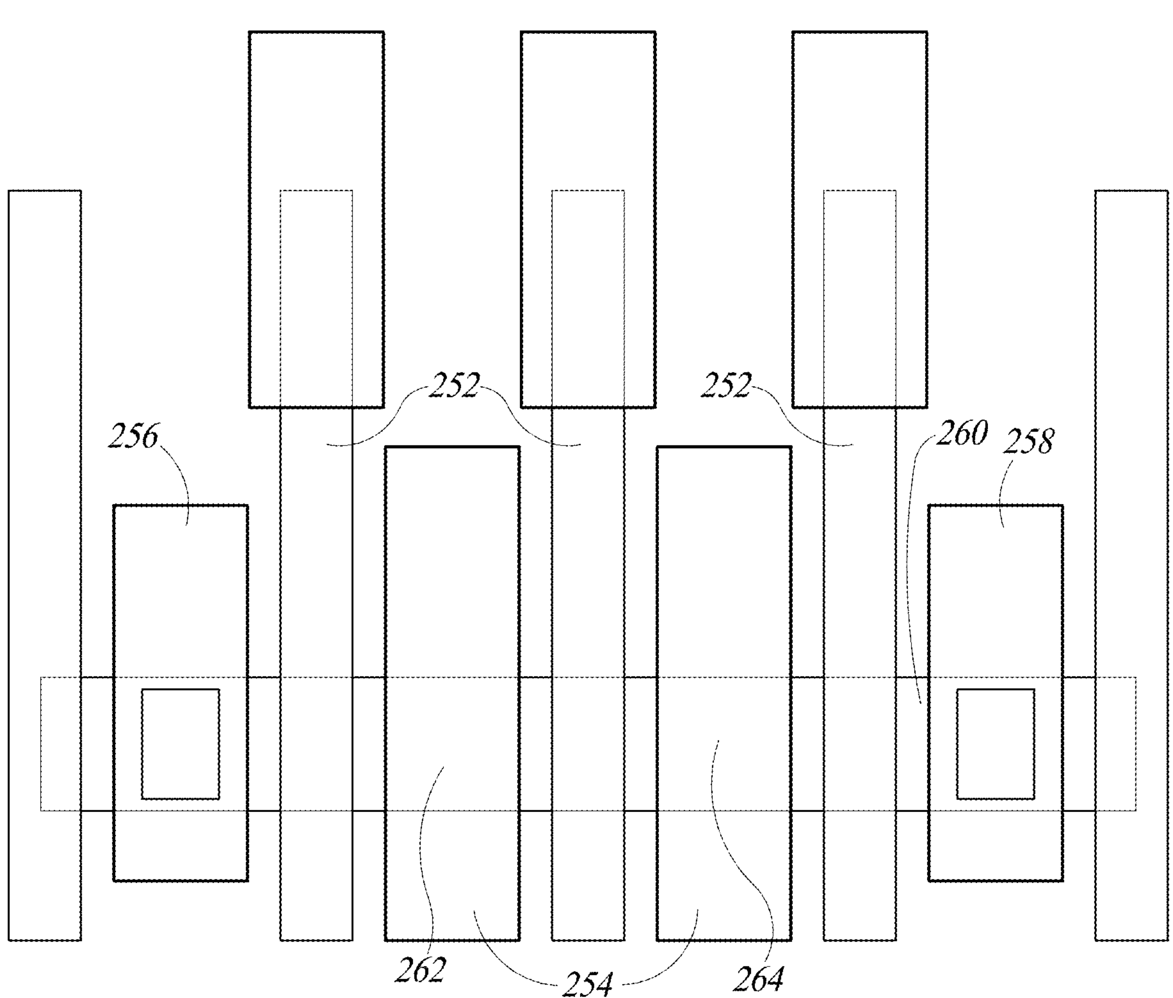

A diagram illustrating a top down view of a two quantum dot array incorporating blind contacts is shown in FIG. 17. The quantum structure, generally referenced 250, comprises barrier gates 252, blind contacts 254, source 256, drain 258, and active silicon channel 260. Two quantum dots 262, 264 are formed in the channel between two barrier gates and its energy is controlled by the potential applied to the blind contacts.

Figure 18:
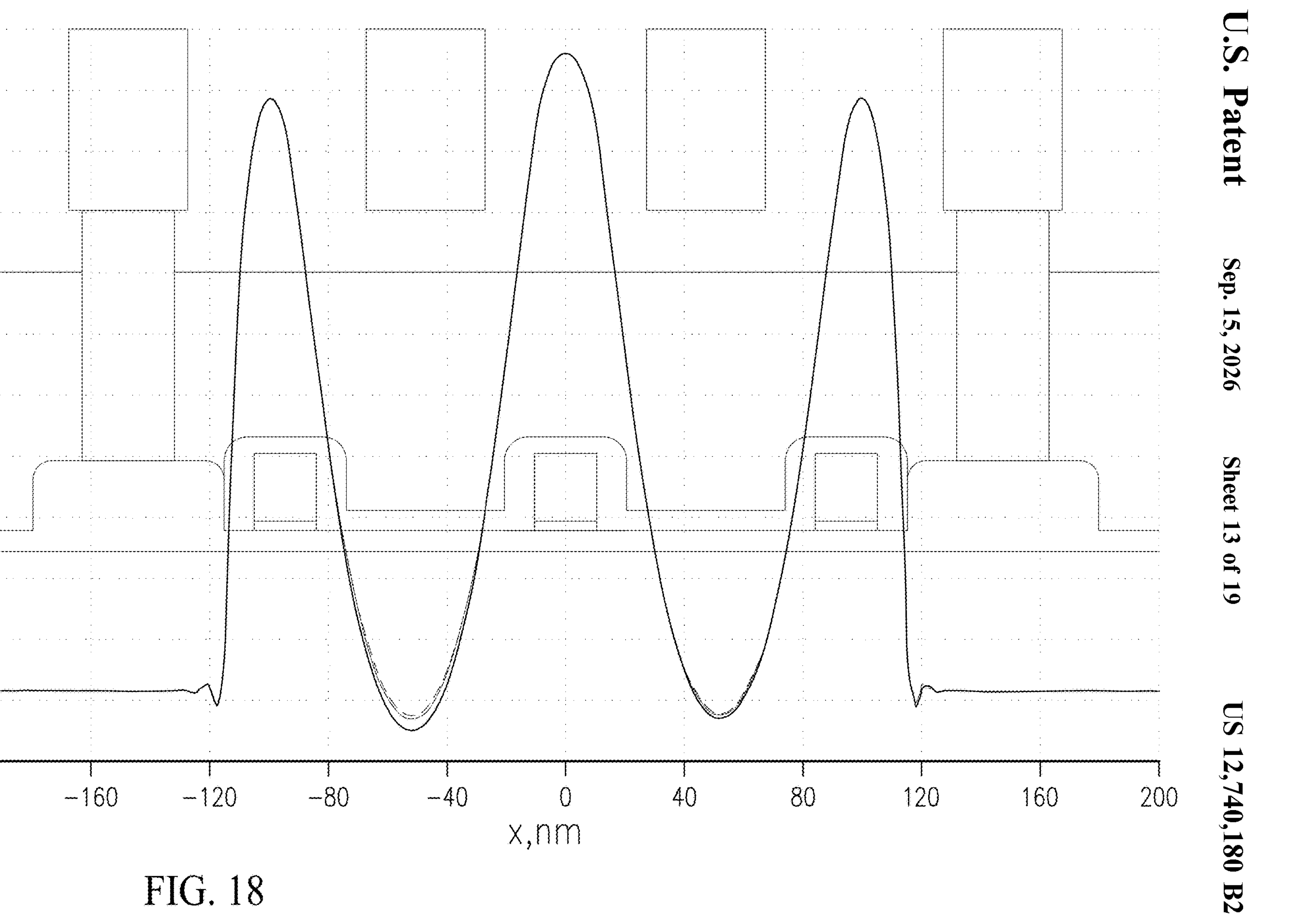
FIG. 18 is a diagram illustrating the effect blind contacts on a double quantum dot structure.

A diagram illustrating the effect of the blind contacts on a double quantum dot structure is shown in FIG. 18. The effect of the blind contacts on the double dot structure of FIGS. 16 and 17 includes the voltage applied to the blind contact acts on the energies of the quantum dots without modifying the barrier gate potential. The blind contacts aid in moving one or more electrons into the quantum wells and to use the quantum wells for spin manipulations. Note that this quantum structure can be modified to a linear array of n quantum dots.

Figure 19:
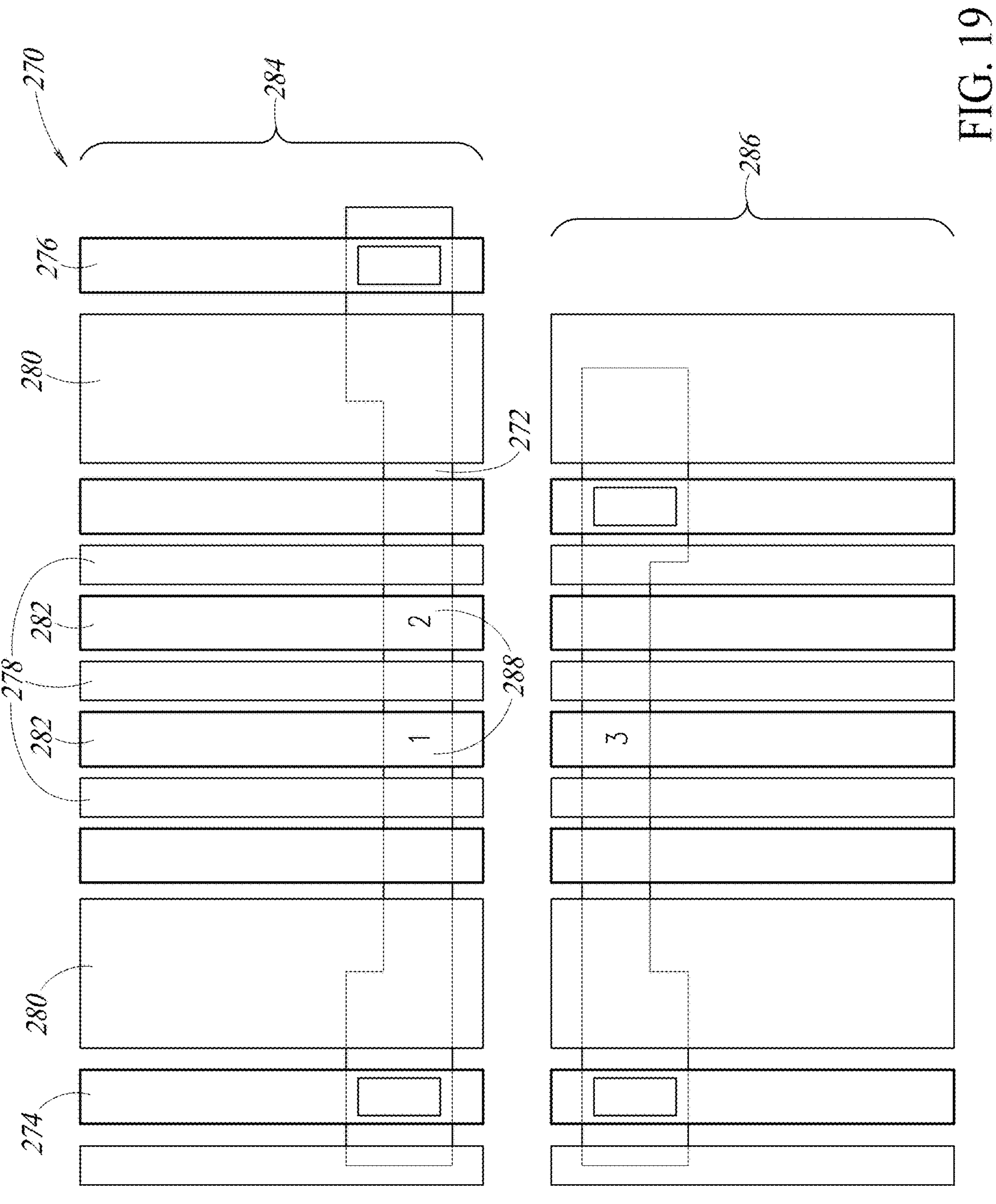
FIG. 19 is a diagram illustrating an example linear quantum dot array incorporating accumulation gates, blind contacts, and a single electron transistor charge sensor.

A diagram illustrating an example linear quantum dot array incorporating accumulation gates, blind contacts, and a single electron transistor charge sensor is shown in FIG. 19. The example linear QDA, generally referenced 270, comprises a linear QDA 284 and charge sensor 286 located in close proximity thereto. The QDA and charge sensor comprises barrier gates 278, blind metal contacts 282, accumulation gates 280, source 274, drain 276, and active silicon channel 272. In one embodiment, the charge sensor 286 includes a single electron transistor (SET) for readout purposes. Two quantum dots 288 are formed in the channel 272 between the accumulation gates 280 and their energy is partly controlled by the voltage applied to the blind contacts. Note that the double linear structure shown includes the quantum dot array 284 with two quantum dots and the charge sensor 286 for electron detection. In this example structure, the accumulation gates 280 are added to both the QDA and SET charge sensor. The accumulation gates are longer gate that serve to extend the distance between source/drain and the quantum dots to help reduce leakage.

In operation, shifting a particle (i.e. electron or hole) into quantum dot 1 causes a modification of the energy in charge sensor quantum dot 3 that functions to detects the charge. On the other hand, occupied quantum dot 2 is too far away from quantum dot 3 which prevents the detection thereof by the charge sensor 286.

Figure 20:
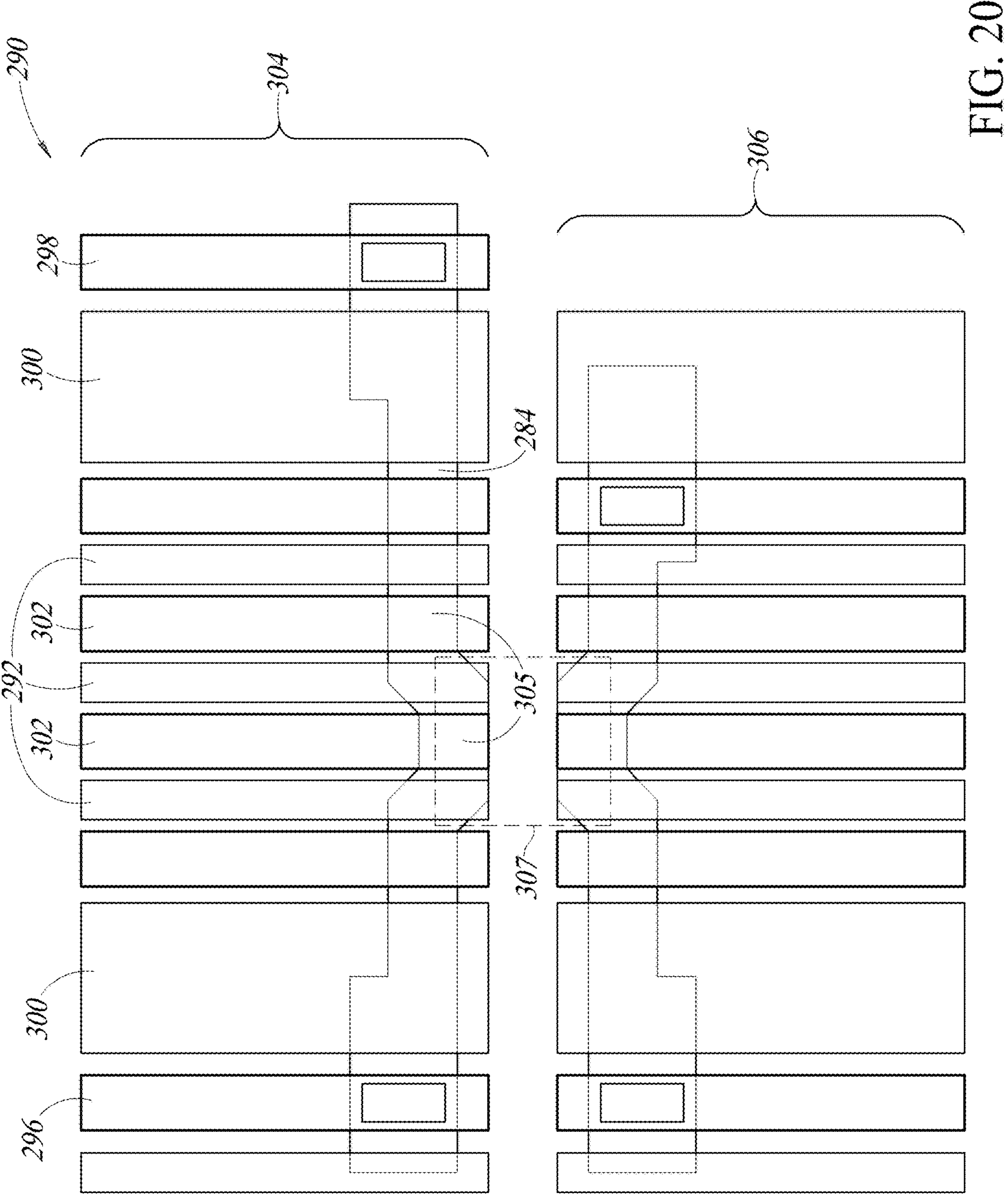
FIG. 20 is a diagram illustrating an example double V shape quantum dot array incorporating accumulation gates, blind contacts, and a single electron transistor charge sensor.

A diagram illustrating an example double V shape quantum dot array incorporating accumulation gates, blind contacts, and a single electron transistor charge sensor is shown in FIG. 20. The double V shaped QDA, generally referenced 290, comprises a V shaped QDA 304 and charge sensor 306 located in close proximity thereto. The QDA and charge sensor comprises barrier gates 292, blind metal contacts 302, accumulation gates 300, source 296, drain 298, and active silicon channel 294. In one embodiment, the charge sensor 306 includes a single electron transistor (SET) for readout purposes. Two quantum dots 305 are formed in the channel 294 between the accumulation gates 300 and their energy is partly controlled by the voltage applied to the blind contacts 302. Operation of the quantum structure of FIG. 20 is similar to that of the quantum structure of FIG. 19 with the difference being the reduced distance for interaction (dashed box 307) provided by the double V shape which increases the coupling between the QDA and charge sensor.

Figure 21:
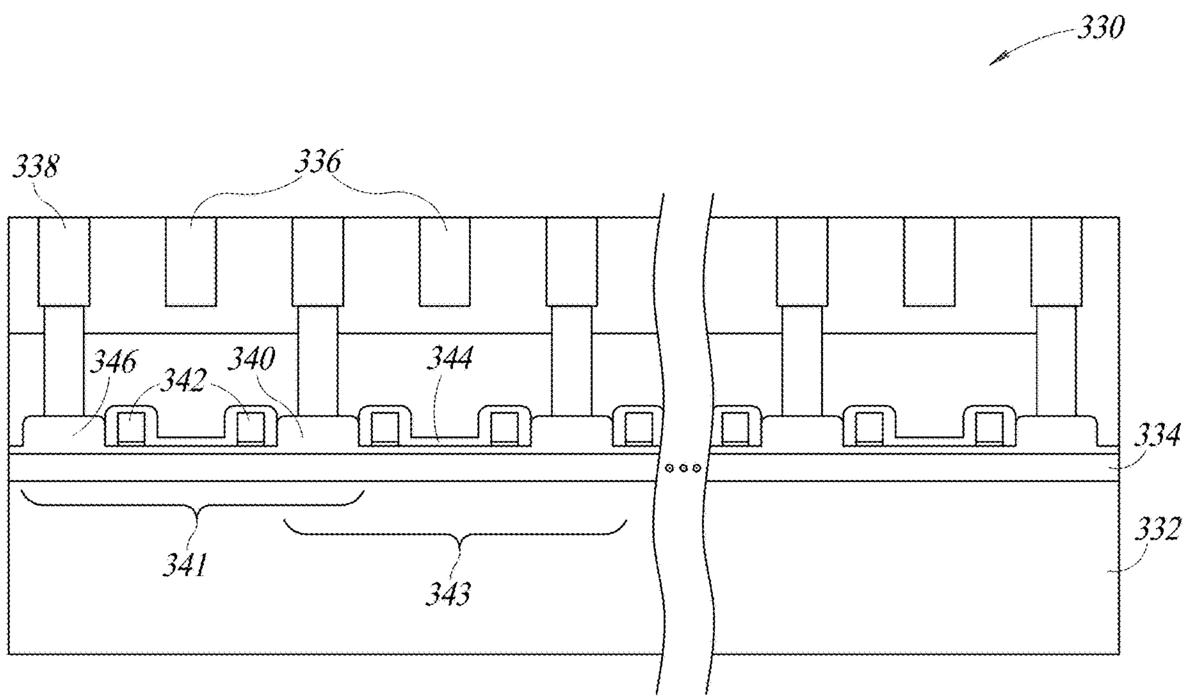
FIG. 21 is a diagram illustrating an example linear array of single-electron transistors serving as an array of charge sensors.

A diagram illustrating an example linear array of single-electron transistors that can serve as an array of charge sensors is shown in FIG. 21. The array, generally referenced 330, comprises an array of single electron charge sensors fabricated on a substrate 332 and BOX layer 334 including for example a first charge sensor 341 and a second charge sensor 343. The fully controlled quantum well is formed in the active layer 344 between the source and drain 340, 346 of each transistor of the array with source/drain 340 being shared between the first and second charge sensor 341, 343. Barrier gates 342 control the heights of the potential barriers that prevents the classical electron/hole flow from source to drain. Blind contacts 336 allow the energy levels in the well to be aligned with the Fermi level of the reservoirs (source/drain). Note that each neighboring pair of quantum dots shares the same metallic blind contact as the shared source and drain 340.

Figure 22:
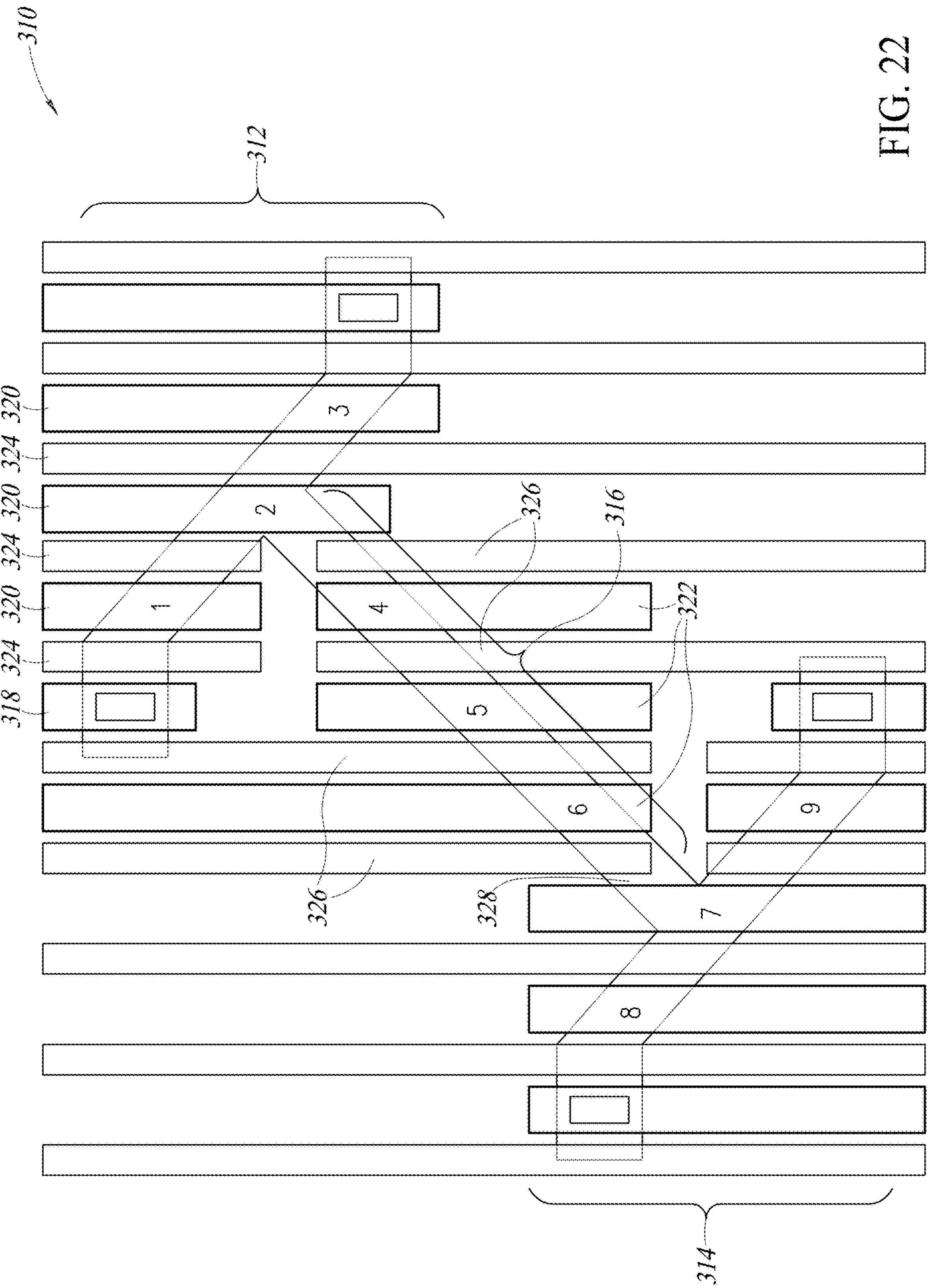
FIG. 22 is a diagram illustrating an example 'H' shaped 2D quantum dot array incorporating two side injectors/sensors.

A diagram illustrating an example 'H' shaped quantum structure incorporating 2D quantum dot array and two side injectors/sensors is shown in FIG. 22. The 'H' shaped quantum structure, generally referenced 310, comprises two charge sensors/pre-charge transistors 312, 314 and a linear QDA 316. The QDA and charge sensor comprise barrier gates 324, 326, blind metal contacts 320, 322, source/drains 318, and active silicon channel 328.

The quantum structure shown includes a 2D quantum dot array 316 with side sensors/injectors 312, 314 configured in an 'H' shape rotated 45 degrees from the alignment line. One key property of the implemented structure 310 is that the channel 328 forms the H-shape using its rotation. This allows the implementation of 2D quantum structures with SETs on both ends of the QDA using standard commercial FDSOI process without modifications.

The sensor/injector quantum dots 1, 2, and 3 in the upper portion and 8, 7, and 9 in the lower portion serve to create so called quantum islands in quantum dots 2 and 7. In one embodiment, the quantum island is a very deep quantum well that can be occupied by hundreds of electrons. The electrons or holes from quantum dots 2 and 7 can be shifted one by one to quantum dots 4, 5, and 6. Then, the presence or absence of charge in quantum dots 4 and 6 can be measured using the side SETs 312, 314 as charge sensors as described supra. It is noted that the 'H' shape of the 2D QDA with charge sensors enables this quantum structure to be implemented using standard FDSOI processes without modifications.

Quantum Computing System

Figure 23:
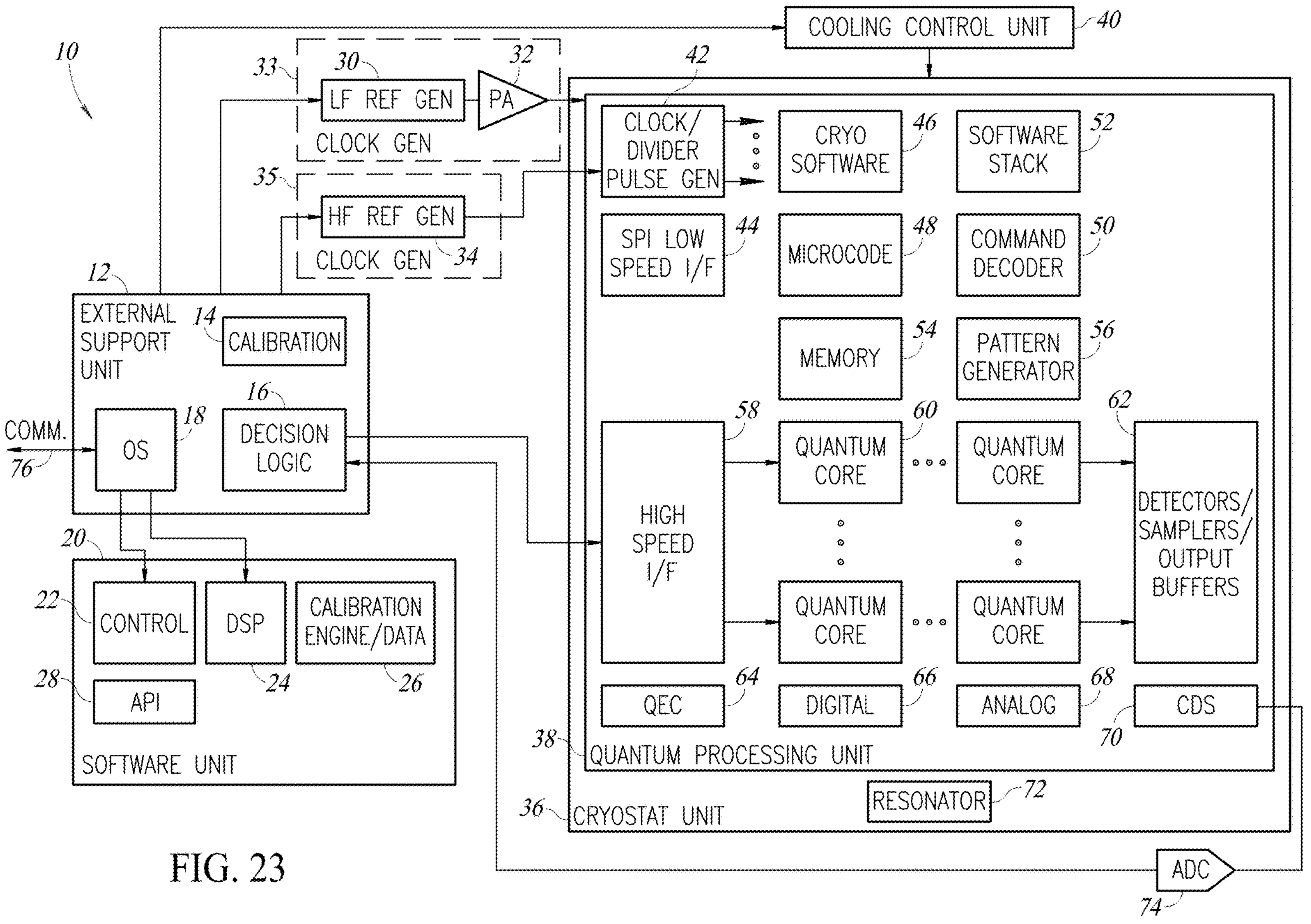
FIG. 23 is a high level block diagram illustrating an example quantum computer system constructed in accordance with the present invention.

A high level block diagram illustrating an example quantum computer system constructed in accordance with the present invention is shown in FIG. 23. The quantum computer, generally referenced 10, comprises a conventional (i.e. not a quantum circuit) external support unit 12, software unit 20, cryostat unit 36, quantum system 38, clock generation units 33, 35, and one or more communication busses between the blocks. The external support unit 12 comprises operating system (OS) 18 coupled to communication network 76 such as LAN, WAN, PAN, etc., decision logic 16, and calibration block 14. Software unit 20 comprises control block 22 and digital signal processor (DSP) 24 blocks in communication with the OS 18, calibration engine/data block 26, and application programming interface (API) 28.

Quantum system 38 comprises a plurality of quantum core circuits 60, high speed interface 58, detectors/samplers/output buffers 62, quantum error correction (QEC) 64, digital block 66, analog block 68, correlated data sampler (CDS) 70 coupled to one or more analog to digital converters (ADCs) 74 as well as one or more digital to analog converters (DACs, not shown), clock/divider/pulse generator circuit 42 coupled to the output of clock generator 35 which comprises high frequency (HF) generator 34. The quantum system 38 further comprises serial peripheral interface (SPI) low speed interface 44, cryostat software block 46, microcode 48, command decoder 50, software stack 52, memory 54, and pattern generator 56. The quantum system 38 can be used to implement the neural network training accelerator of the present invention. The clock generator 33 comprises low frequency (LF) generator 30 and power amplifier (PA) 32, the output of which is input to the quantum system 38. Clock generator 33 also functions to aid in controlling the spin of the quantum particles in the quantum cores 60.

The cryostat unit 36 is the mechanical system that cools the quantum system down to cryogenic temperatures. The deep cryogenic temperatures also help to speed up the digital and mixed-signal circuits while reducing their dynamic and static power (lower leakage). Typically, it is made from metal and it can be fashioned to function as a cavity resonator 72. It is controlled by cooling unit control 40 via the external support unit 12. The cooling unit control 40 functions to set and regulate the temperature of the cryostat unit 36. By configuring the metal cavity appropriately, it can be made to resonate at a desired frequency. A clock is then driven via a power amplifier which is used to drive the resonator which creates a magnetic field. This magnetic field can function as an auxiliary magnetic field to aid in controlling one or more quantum structures in the quantum core.

The external support unit/software units may comprise any suitable computing device or platform such as an FPGA/SoC board. In one embodiment, it comprises one or more general purpose CPU cores and optionally one or more special purpose cores (e.g., DSP core, floating point, etc.) that interact with the software stack that drives the hardware, i.e. the QPU. The one or more general purpose cores execute general purpose opcodes while the special purpose cores execute functions specific to their purpose. Main memory comprises dynamic random access memory (DRAM) or extended data out (EDO) memory, or other types of memory such as ROM, static RAM, flash, and non-volatile static random access memory (NVSRAM), bubble memory, etc. The OS may comprise any suitable OS capable of running on the external support unit and software units, e.g., Windows, MacOS, Linux, QNX, NetBSD, etc. The software stack includes the API, the calibration and management of the data, and all the necessary controls to operate the external support unit itself. In one embodiment, the external support unit/software units are adapted to implement the mapping and detection in the classic helper neural networks as described in more detail infra.

The clock generated by the high frequency clock generator 35 is input to the clock divider 42 that functions to generate the signals that drive the quantum system. Low frequency clock signals are also input to and used by the QPU. A slow serial/parallel interface (SPI) 44 functions to handle the control signals to configure the quantum operation in the quantum system. The high speed interface 58 is used to pump data from the classic computer, i.e. the external support unit, to the quantum system. The data that the quantum system operates on is provided by the external support unit.

Non-volatile memory may include various removable/non-removable, volatile/nonvolatile computer storage media, such as hard disk drives that reads from or writes to non-removable, nonvolatile magnetic media, a magnetic disk drive that reads from or writes to a removable, non-volatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

The computer may operate in a networked environment via connections to one or more remote computers. The remote computer may comprise a personal computer (PC), server, router, network PC, peer device or other common network node, or another quantum computer, and typically includes many or all of the elements described supra. Such networking environments are commonplace in offices, enterprise-wide computer networks, intranets and the Internet.

When used in a LAN networking environment, the computer is connected to the LAN via network interface 76. When used in a WAN networking environment, the computer includes a modem or other means for establishing communications over the WAN, such as the Internet. The modem, which may be internal or external, is connected to the system bus via user input interface, or other appropriate mechanism.

Computer program code for carrying out operations of the present invention may be written in any combination of one or more programming languages, including an object oriented programming language such as Java, Smalltalk, C++, C# or the like, conventional procedural programming languages, such as the "C" programming language, and functional programming languages such as Python, Hotlab, Prolog and Lisp, machine code, assembler or any other suitable programming languages.

Also shown in FIG. 1 is the optional data feedback loop between the quantum system 38 and the external support unit 12 provided by the partial quantum data read out. The quantum state is stored in the qubits of the one or more quantum cores 60. The detectors 62 function to measure/collapse/detect some of the qubits and provide a measured signal through appropriate buffering via CDS 70 to the output ADC block 74. The resulting digitized signal is sent to the decision logic block 16 of the external support unit 12 which functions to reinject the read out data back into the quantum state through the high speed interface 58 and quantum initialization circuits. In an alternative embodiment, the output of the ADC is fed back to the input of the quantum system.

In one embodiment, the quantum core comprises quantum dots that exhibit a quantum effect, is capable of forming entangled states, and is capable of performing energy optimization. Ultimately, the minimum energy quantum state is read out of the quantum core and used in subsequent processing.

In one embodiment, quantum error correction (QEC) is performed via QEC block 64 to ensure no errors corrupt the read out data that is reinjected into the overall quantum state. Errors may occur in quantum circuits due to noise or inaccuracies similarly to classic circuits. Periodic partial reading of the quantum state function to refresh all the qubits in time such that they maintain their accuracy for relatively long time intervals and allow the complex computations required by a quantum computing machine.

It is appreciated that the architecture disclosed herein can be implemented in numerous types of quantum computing machines. Examples include semiconductor quantum computers, superconducting quantum computers, magnetic resonance quantum computers, optical quantum computers, etc. Further, the qubits used by the quantum computers can have any nature, including charge qubits, spin qubits, hybrid spin-charge qubits, etc.

In one embodiment, the quantum structure disclosed herein is operative to process a single particle at a time. In this case, the particle can be in a state of quantum superposition, i.e. distributed between two or more locations or charge qdots. In an alternative embodiment, the quantum structure processes two or more particles at the same time that have related spins. In such a structure, the entanglement between two or more particles could be realized. Complex quantum computations can be realized with such a quantum interaction gate/structure or circuit.

In alternative embodiments, the quantum structure processes (1) two or more particles at the same time having opposite spin, or (2) two or more particles having opposite spins but in different or alternate operation cycles at different times. In the latter embodiment, detection is performed for each spin type separately.

Note that in one embodiment the quantum system 38 is fabricated on a single chip and comprises quantum cores 60 and a classical controller comprising a plurality of driver circuits, detector circuits, and complementary metal oxide semiconductor (CMOS) processor. The quantum system is typically in communication with another classical processor for administration, configuration, and control.

As an example of advanced CMOS, the 22 nm FDSOI process is capable of providing scalability of qubits. Similar to an integrated circuit (IC) chip, where a single nanometer-scale CMOS transistor can be reliably replicated billions of times to build a large digital processor, a position-based charge qubit structure, a spin-based qubit structure, or a hybrid thereof which can be realized as a CMOS compatible coupled quantum system (e.g., quantum dot array (QDA)) in a way that satisfies the manufacturer's design rule check (DRC) with possible minor exceptions signed off by process engineers. The qubit structure is replicated thousands or millions of times to construct a single chip quantum processor operating at 4 K where the cooling requirements are modest.

In one embodiment, the quantum system combines the best features of charge (i.e. high-speed operation) and spin (i.e. long coherence times) qubits in a so called hybrid qubit. Such a hybrid qubit can be controlled electrically without the need for microwave pulses but it requires a solid magnet of 0.5-1 T which can be added to a 4 K cryo chamber. The control and detection of quantum spin states can be based on utilizing the Pauli exclusion principle which dictates that two electrons of the same spin cannot occupy the same quantum dot. The required movement of electrons between quantum dots to try to force them into one quantum dot and the subsequent position detection constitutes the part of charge qubit.

Note that the 22 nm FDSOI process has unique benefits for quantum operation. In contrast to bulk CMOS, FDSOI provides a thin semiconductor layer isolated vertically from the substrate by a 20 nm buried oxide (BOX) layer. Therefore, a quantum particle can be strictly confined inside the 5 nm thin semiconductor film where it precisely follows the gate control and is isolated from the substrate impurities to further increase its decoherence time.

In one embodiment, quantum dots are nanoscopic in size. They are constructed in CMOS using the minimum dimensions that the fabrication process allows. They are small enough to accommodate a single quantum particle, i.e. electron or hole, to hold the quantum information either in its magnetic spin (up or down) or position (being present or absent in a given quantum dot). Note that the underlying principle of quantum dot is a Coulomb blockade by exerting a repulsive force preventing other electrons from joining in and occupying the same space. The key parameter is its capacitance to the background. For a quantum dot of small enough capacitance C, a single electron of charge e entering will decrease the electric voltage potential by observable, while presenting the energy barrier of. For example, an island of a 20 aF capacitance, which can be readily created in CMOS by resorting to a minimum size of the diffusion area, exhibits the single electron charging energy of 4 meV. It is an order of magnitude greater than the thermal energy kT=0.36 meV at T=4.2 K, where k is Boltzmann's constant. This prevents thermally excited electrons from tunneling into the island.

Quantum Operation

To aid in understanding the principles of the present invention, a brief explanation of quantum operation is presented below.

As stated supra, in classic electronics, the unit of information is a bit that can represent only one of the two states "0" and "1" at a given time. Computations in classical computers are performed sequentially and every bit can hold only one state at a time.

As stated supra, quantum electronics uses the quantum behavior of particles to perform computations. The unit of quantum information is a quantum bit or qubit. A qubit has two base states denoted by $\hat{0}$ and $\hat{1}$ (or |0> and |1>) (a qudit can have additional states) but in contrast with a classic bit, a qubit can be in a superposed state that contains some percentage (complex-valued amplitude 'a') of state $\hat{0}$, and some percentage (complex-valued amplitude 'b') of state $\hat{1}$ denoted by a state $a\hat{0}+b\hat{1}$. Since a qubit in quantum structures can simultaneously be in multiple superposed states, multiple sets of computations can be performed concurrently, resulting in large quantum computation speed-ups, when compared with classic computations.

A quantum particle is described by its position and/or spin. The particles used in quantum structures are called quantum particles. There are qubits based on the quantum position of the particles, also named charge-qubits, while other qubits use the spin of the quantum particles, also named spin-qubits. In quantum structures, the charge carriers are held in specific regions called quantum dots or qdots. A quantum structure is constructed from one or more qdots.

Performing a quantum computation involves several steps. First the structure needs to be reset, which means that all the free carriers (e.g., electrons or holes) from the structure need to be flushed out. Once the free carriers are removed, the structure is initialized meaning particles are introduced in one of the base states (e.g., $\hat{0}$ or $\hat{1}$). In the case of a charge-qubit (position-qubit) it means that a carrier is loaded in one of the qdots. A free carrier not coming from the quantum initialization process can interact with the quantum particles and result in decoherence, i.e. loss of quantum information. After the particles have been loaded in the corresponding base states they undergo the desired quantum operation under control of gate control terminals. Once the desired quantum operations are complete, a detection is performed whereby the presence or absence of a particle in a given qdot at a given time is tested. Detection is usually destructive which means that the quantum particle's wavefunction and its state collapse. Special nondestructive detection/measurement exist that do not collapse the quantum state. In such cases, multiple measurements of the same quantum state can be performed.

The position of a quantum particle is given by the region where the particle wavefunction is mostly present. In one embodiment, quantum structures use semiconductor qdots realized with semiconductor wells where the particle transport is done through tunneling which is a quantum effect. The tunneling or particle transport is controlled by control terminals. In one embodiment, the control terminals are realized using gates but they may comprise other semiconductor process layers.

Figure 24:
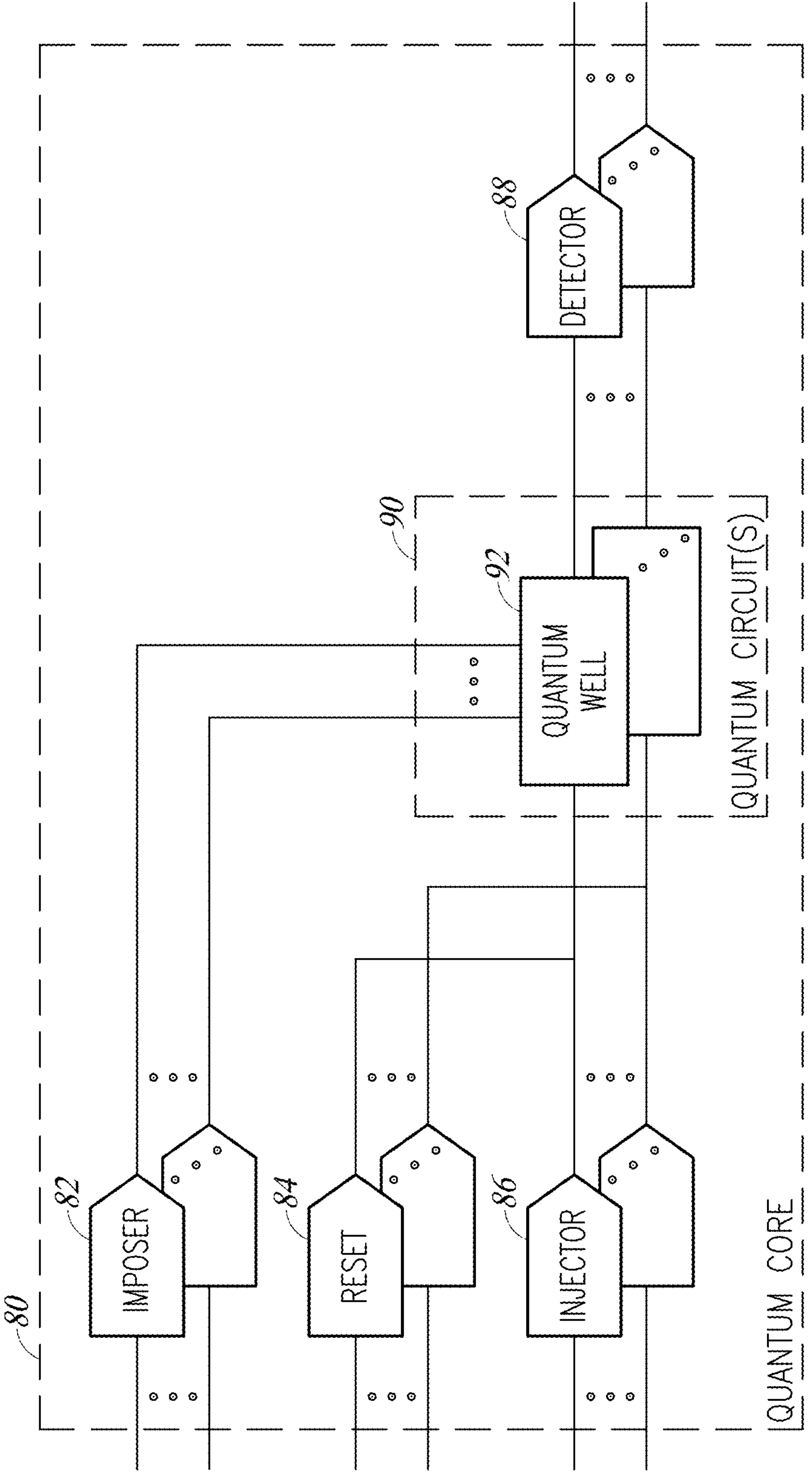
FIG. 24 is a diagram illustrating an example quantum core incorporating one or more quantum circuits.

A diagram illustrating an example quantum core incorporating one or more quantum circuits is shown in FIG. 24. The quantum core, generally referenced 80, comprises one or more quantum circuits 90 each comprising one or more quantum wells 92. Each quantum circuit has corresponding reset circuitry 84, injector circuitry 86, imposer circuitry 82, and detector circuitry 88 that together electronically control the operation of the semiconductor quantum circuit. In one embodiment, the reset, injector, imposer, and detector circuits of the quantum interaction gate/circuit/core are controlled by analog signals generated by a plurality of digital to analog converters (DACs) (not shown).

It is appreciated that one skilled in the art can combine the above described embodiments, methods, and techniques in any desired combination to create additional systems that e.g., accelerate learning of a classic NN, accelerate inference of a classic NN, improve reliability, increase speed, reduce energy consumption, etc. For example, RCNNs may be used in the help NNs not just for inference but for training acceleration as well. In addition, quantum tomography may be used for both inference and training acceleration.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A quantum structure, comprising:

a substrate;

a substantially undoped layer fabricated on said substrate including an active channel;

a raised source and drain fabricated on said substantially undoped layer;

one or more barrier gates fabricated on said substantially undoped layer between said raised source and drain and operative to control a potential barrier between quantum dots on either side of said one or more barrier gates; and one or more metal blind contacts not in contact with said active channel, disposed between said one or more barrier gates and above quantum dots located between the one or more barrier gates, said one or more metal blind contacts operative to provide additional dedicated control of an electrostatic potential profile and electric field of quantum dots between said one or more barrier gates.

2. The quantum structure according to claim 1, wherein a dielectric below each blind contact is selected from a group consisting of silicon dioxide, silicide, aluminum oxide, hafnium oxide, tantalum oxide, low-k dielectric, and silicon nitride.

3. The quantum structure according to claim 1, wherein said substantially undoped layer is formed as a silicon on insulator or as a 3D structure over a bulk silicon wafer.

4. The quantum structure according to claim 1, further comprising an electronic spin resonance (ESR) metal strip operative to generate ac magnetic field pulses to control quantum dot spin rotation.

5. The quantum structure according to claim 1, further comprising a back gate biased to provide additional tuning of a shape of the quantum dots.

6. The quantum structure according to claim 1, wherein the fabrication of said one or more metal blind contacts allows a decreased effective gate pitch than would otherwise be possible to fabricate in a given process technology.

7. A quantum structure, comprising:

a substrate;

a substantially undoped layer fabricated on said substrate including an active channel;

a quantum dot array (QDA) fabricated on said substantially undoped layer, said QDA comprising:

a plurality of barrier gates fabricated on said substantially undoped layer between a raised source and drain, each barrier gate operative to control a potential barrier between adjacent quantum dots;

a plurality of blind contacts not in contact with said active channel, each blind contact disposed between adjacent barrier gates and fabricated in a metal layer above a quantum dot, said blind contacts operative to provide additional control of energy of a respective quantum dot; and a single electron transistor (SET) charge sensor fabricated in close proximity to said QDA on said undoped layer and operative to detect a presence or absence of charge in said QDA.

8. The quantum structure according to claim 7, wherein a dielectric below each blind contact is selected from a group consisting of silicon dioxide, silicide, aluminum oxide, hafnium oxide, tantalum oxide, low-k dielectric, and silicon nitride.

9. The quantum structure according to claim 7, wherein said substantially undoped layer is formed as a silicon on insulator or as a 3D structure over a bulk silicon wafer.

10. The quantum structure according to claim 7, further comprising a back gate common for the entire quantum structure and biased to provide additional tuning of a shape of the quantum dots.

11. The quantum structure according to claim 7, further comprising an electronic spin resonance (ESR) metal strip operative to generate ac magnetic field pulses to control quantum dot spin rotation.

12. A quantum structure, comprising:

a substrate;

a substantially undoped layer fabricated on said substrate including an active channel;

a quantum dot array (QDA) fabricated on said substantially undoped layer, said QDA comprising:

a plurality of barrier gates fabricated on said substantially undoped layer between a source and drain, each barrier gate operative to control a potential barrier between adjacent quantum dots;

a plurality of blind contacts not in contact with said active channel, each blind contact disposed between adjacent barrier gates and fabricated in a metal layer above a quantum dot, said blind contacts operative to provide additional control of energy of a respective quantum dot;

a plurality of sensors/injectors fabricated on said substantially undoped layer and operative to inject and detect one or more particles in said QDA; and wherein said QDA and sensors/injectors are arranged in an 'H' shape configuration rotated 45 degrees from an alignment line.

13. The quantum structure according to claim 12, wherein a dielectric below each blind contact is selected from a group consisting of silicon dioxide, silicide, aluminum oxide, hafnium oxide, tantalum oxide, low-k dielectric, and silicon nitride.

14. The quantum structure according to claim 12, wherein said undoped layer is formed as a silicon on insulator or as a 3D structure over a bulk silicon wafer.

15. The quantum structure according to claim 12, further comprising a back gate common for the entire quantum structure and biased to provide additional tuning of a shape of the quantum dots.

16. The quantum structure according to claim 12, further comprising an electronic spin resonance (ESR) metal strip operative to generate ac magnetic field pulses to control quantum dot spin rotation.

* * * * *